United States Patent
Yamaki et al.

(10) Patent No.: US 12,165,725 B2
(45) Date of Patent: Dec. 10, 2024

(54) MEMORY SYSTEM AND METHOD

(71) Applicant: Kioxia Corporation, Tokyo (JP)

(72) Inventors: Ryo Yamaki, Yokohama Kanagawa (JP); Masanobu Shirakawa, Chigasaki Kanagawa (JP); Naomi Takeda, Yokohama Kanagawa (JP); Takashi Nakagawa, Chofu Tokyo (JP); Shingo Yanagawa, Kawasaki Kanagawa (JP)

(73) Assignee: Kioxia Corporation, Tokyo (JP)

(*) Notice: Subject to any disclaimer, the term of this patent is extended or adjusted under 35 U.S.C. 154(b) by 0 days.

(21) Appl. No.: 18/230,151

(22) Filed: Aug. 3, 2023

(65) Prior Publication Data
US 2024/0055065 A1 Feb. 15, 2024

(30) Foreign Application Priority Data
Aug. 9, 2022 (JP) ................. 2022-127176

(51) Int. Cl.
*G11C 29/00* (2006.01)
*G11C 29/12* (2006.01)

(52) U.S. Cl.
CPC ......... *G11C 29/12005* (2013.01); *G11C 2029/1202* (2013.01)

(58) Field of Classification Search
CPC ......... G11C 16/26; G11C 11/5642; G11C 2029/1202; G11C 29/42; G11C 29/021; G11C 29/12005
See application file for complete search history.

(56) References Cited

U.S. PATENT DOCUMENTS

| | | | | |
|---|---|---|---|---|
| 9,640,270 B2 * | 5/2017 | Alrod | ................ | G06F 11/0793 |
| 9,665,426 B2 * | 5/2017 | Chen | ................ | G11C 29/52 |
| 10,417,087 B2 * | 9/2019 | Lu | ................ | G06F 11/1012 |
| 10,510,405 B2 | 12/2019 | Barndt et al. | | |
| 10,719,396 B2 | 7/2020 | Asami et al. | | |
| 10,998,057 B2 | 5/2021 | Choi et al. | | |
| 11,335,417 B1 * | 5/2022 | Zhang | ................ | G11C 11/5642 |

FOREIGN PATENT DOCUMENTS

JP 2019-164850 A 9/2019

* cited by examiner

*Primary Examiner* — Esaw T Abraham
(74) *Attorney, Agent, or Firm* — Maier & Maier, PLLC

(57) ABSTRACT

According to one embodiment, a memory system includes a non-volatile first memory with first storage areas. A controller executes a first read operation on a second storage area of the first storage areas. When an error correction in the first read operation fails, the controller acquires a first measured value being a value of a read voltage for suppressing the number of occurrences of error bits in the second storage area. The controller updates, on the basis of the first measured value, one of first candidate values of the read voltage with a second candidate value. When the error correction in a second read operation for a third storage area of the first storage areas fails, the controller executes the read operation once or more on the third storage area by using, as the read voltages, different first candidate values of the first candidate values.

20 Claims, 17 Drawing Sheets

FIG.6

| INDEX (ID) | SHIFT AMOUNT A | SHIFT AMOUNT B | SHIFT AMOUNT C | SHIFT AMOUNT D | SHIFT AMOUNT E | SHIFT AMOUNT F | SHIFT AMOUNT G |
|---|---|---|---|---|---|---|---|
| | FIXED | | VARIABLE | | | FIXED | |
| 0 | | | | | | | |
| 1 | | | | | | | |
| 2 | | | | | | | |
| 3 | | | | | | | |
| 4 | | | | | | | |
| ... | | | | | | | |
| I_last | | | | | | | |

221

| MANAGEMENT AREA (BLOCK NUMBER) | SHIFT PATTERN (MANAGEMENT ID) |
|---|---|
| 0 | 3 |
| 1 | 1 |
| 2 | 2 |
| 3 | 0 |
| ⋮ | ⋮ |

HISTOGRAM (8 BINS) 250

ESTIMATION MATRIX
(8 ROWS × 7 COLUMNS)
260

= ( Vra, Vrb, Vrc, Vrd, Vre, Vrf, Vrg )

MEMORY SYSTEM AND METHOD

CROSS-REFERENCE TO RELATED APPLICATION

This application is based upon and claims the benefit of priority from Japanese Patent Application No. 2022-127176, filed on Aug. 9, 2022; the entire contents of which are incorporated herein by reference.

FIELD

Embodiments described herein relate generally to a memory system and a method.

BACKGROUND

Conventionally, a memory system including a memory cell transistor has been widely known. In a read operation executed by such a memory system, data held in the memory cell transistor is determined on the basis of a comparison between a threshold voltage of the memory cell transistor and a read voltage.

The threshold voltage of the memory cell transistor may change due to various factors. Therefore, the memory system is configured to be able to change the read voltage value. When erroneous data determination occurs in the read operation, the memory system is able to change the read voltage value and retry the read operation.

BRIEF DESCRIPTION OF THE DRAWINGS

FIG. 6 is a diagram illustrating an example of a data structure of a shift index table according to the embodiment;

DETAILED DESCRIPTION

According to one embodiment, a memory system includes a non-volatile first memory, a second memory, and a controller. The first memory includes a plurality of first storage areas. Each of the first storage areas includes a word line and a plurality of memory cells connected to the word line. The second memory is configured to store a plurality of first candidate values each distinguished by an index. The controller is configured to execute a first read operation and an error correction. The first read operation is an operation of executing a read operation on a second storage area of the plurality of first storage areas to acquire data from the plurality of memory cells by using read voltages corresponding to threshold voltages of the plurality of memory cells. The error correction is executed on the data acquired by the first read operation. The controller is configured to execute a measurement operation on the second storage area when the error correction on the data acquired by the first read operation fails. The measurement operation is an operation of acquiring a first measured value on the basis of a group of determination results. The first measured value is a value of the read voltage for suppressing a number of occurrences of error bits. The group of determination results is obtained by determining, multiple times, on/off of the plurality of memory cells while varying the read voltage. The controller is configured to update, on the basis of the first measured value, a first candidate value corresponding to a first-value index of the plurality of first candidate values. The controller is configured to execute a second read operation and an error correction. The second read operation is an operation of executing the read operation on a third storage area of the plurality of first storage areas. The error correction is executed on data acquired by the second read operation. The controller is configured to execute a third read operation once or more when the error correction on the data acquired by the second read operation fails. The third read operation is an operation of executing the read operation once or more on the third storage area by using, as the read voltages, different first candidate values of the plurality of first candidate values.

Hereinafter, a memory system and a method according to an embodiment will be described in detail with reference to the accompanying drawings. Note that the present invention is not limited by these embodiments.

Embodiment

Figure 1:
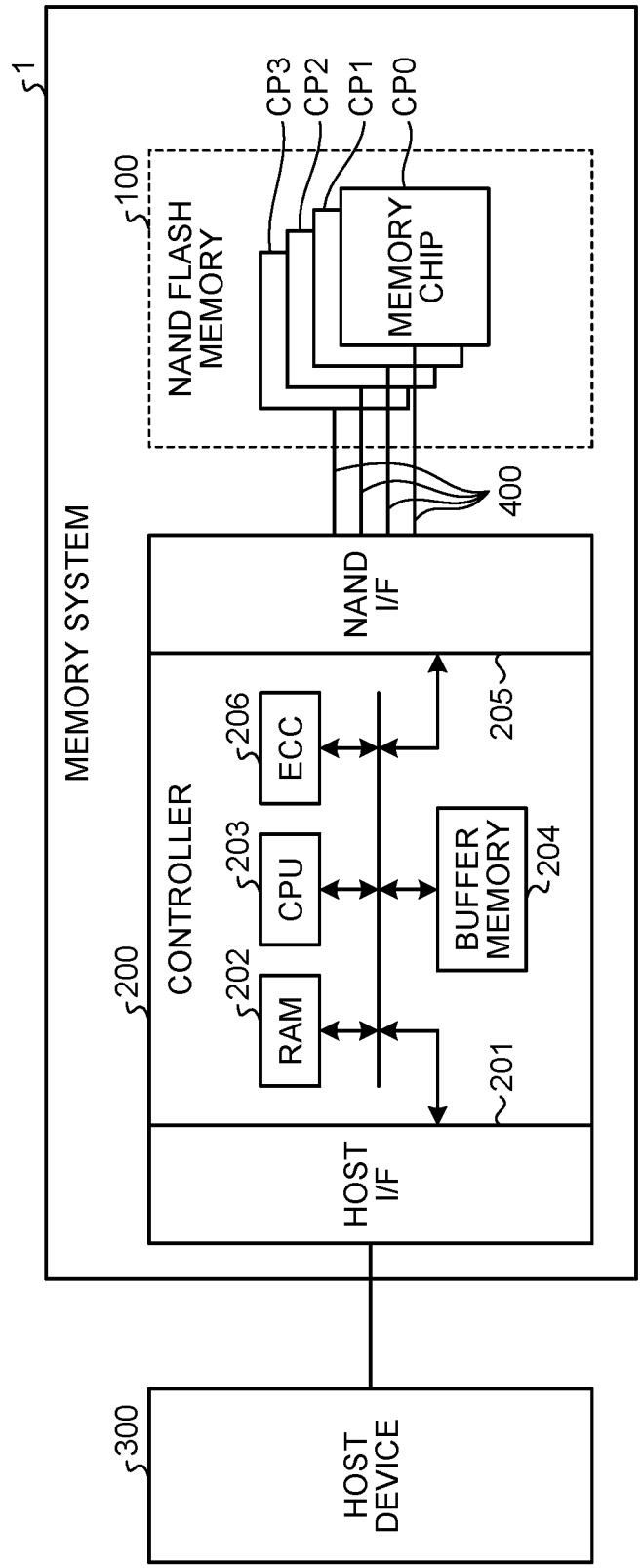
FIG. 1 is a diagram illustrating a configuration example of a memory system according to an embodiment.

FIG. 1 is a diagram illustrating a configuration example of a memory system according to an embodiment. As illustrated in FIG. 1, a memory system 1 is connectable to a host device 300. The host device 300 corresponds to, for example, a server, a personal computer, or a mobile information processing apparatus. The memory system 1 functions as an external storage device for the host device 300.

The host device 300 can issue a request to the memory system 1. The request includes a read request and a write request.

The memory system 1 includes one or more memory chips CP and one controller 200 as a NAND flash memory 100. Here, the memory system 1 includes memory chips CP0, CP1, CP2, and CP3 as one or more memory chips CP. Note that the number of memory chips CP included in the memory system 1 is not limited to four.

Each of the memory chips CP includes a plurality of memory cell transistors, and can store data in a non-volatile manner. Each of the memory chips CP is connected to the controller 200 by a NAND bus 400. Each of the memory chips CP is an example of a first memory.

The controller 200 includes a host interface circuit (HOST I/F) 201, a random access memory (RAM) 202, a central processing unit (CPU) 203, a buffer memory 204, a NAND interface circuit (NAND I/F) 205, and an error correction code circuit (ECC) 206. The controller 200 can be configured as, for example, a system-on-a-chip (SoC). The controller 200 may include a plurality of chips. The controller 200 may include a field-programmable gate array (FPGA) or an application specific integrated circuit (ASIC) instead of the CPU 203. In other words, the controller 200 may be configured by software, hardware, or a combination thereof. The RAM 202 may be disposed outside the controller 200.

The host interface circuit 201 is connected to the host device 300 via a bus conforming to, for example, the serial advanced technology attachment (SATA) standards, the serial attached SCSI (SAS) standards, or the peripheral components interconnect (PCI) express (registered trademark) standards, and manages communication between the controller 200 and the host device 300.

The NAND interface circuit 205 is connected to each of the memory chips CP via the NAND bus 400, and manages communication between the controller 200 and the memory chips CP.

The CPU 203 controls the operation of the controller 200.

The RAM 202 is used as a work area of the CPU 203. A buffer memory 204 temporarily holds data transmitted to the memory chips CP and data received from the memory chips CP. The RAM 202 and the buffer memory 204 can be configured by, for example, a dynamic random access memory (DRAM), a static random access memory (SRAM), or a combination thereof. Note that types of memories configuring the RAM 202 and the buffer memory 204 are not limited thereto.

The RAM 202 is an example of a second memory and a third memory. The second memory and the third memory may be configured by one RAM 202, as in the embodiment, or may be configured by different memories.

An ECC 206 detects an error and corrects the error detected using an error correction code. Detection of the error and correction of the detected error are simply referred to as error correction.

Figure 2:
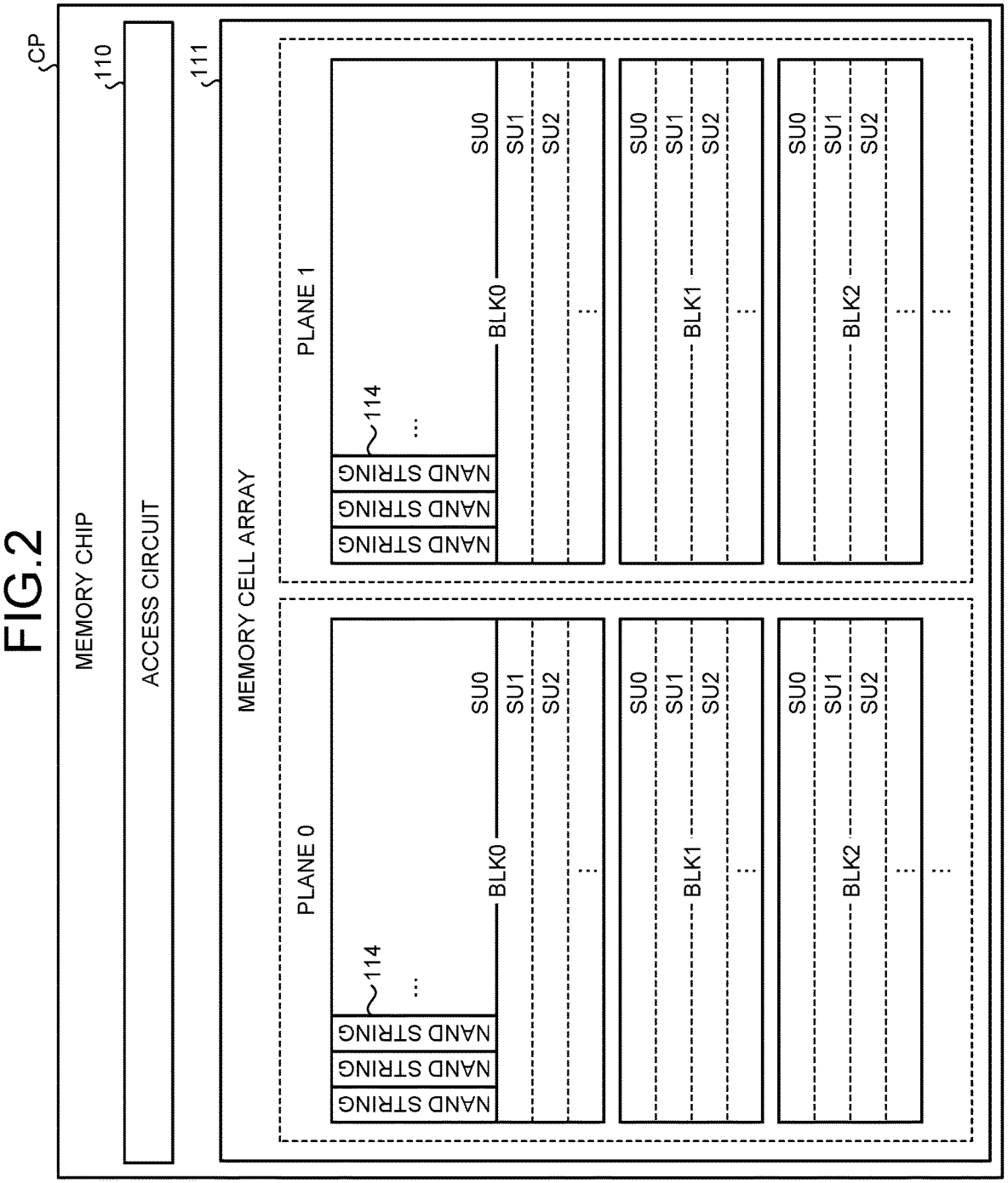
FIG. 2 is a diagram illustrating a configuration example of a memory chip according to the embodiment.

FIG. 2 is a diagram illustrating a configuration example of the memory chip CP. As illustrated, the memory chip CP includes an access circuit 110 and a memory cell array 111.

The memory cell array 111 is divided into a plurality of planes (plane 0 and plane 1). Each plane is a sub-array that can be accessed in parallel. Each plane includes a plurality of blocks BLK (BLK0, BLK1, and so on) and each of the blocks BLK is a set of a plurality of non-volatile memory cell transistors. Each of the blocks BLK includes a plurality of string units SU (SU0, SU1, and so on), and each of the string units SU is a set of memory cell transistors associated with a word line and a bit line. Each of the string units SU includes a plurality of NAND strings 114 to which memory cell transistors are connected in series. Note that the number of NAND strings 114 in the string unit SU is optional. Note that the number of planes included in the memory cell array 111 is not limited to two. In addition, the memory cell array 111 is not necessarily divided.

The block BLK is an example of a first storage area.

The access circuit 110 includes, for example, a row decoder, a column decoder, a sense amplifier, a latch circuit, and a voltage generation circuit. The access circuit 110 executes a program operation, a sense operation, and an erase operation on the memory cell array 111 of each plane according to a command from the controller 200.

The program operation is an operation of writing data in the memory cell array 111. The sense operation is an operation of reading data from the memory cell array 111.

Note that a series of operations in which the controller 200 writes data to the memory chip CP is referred to as a write operation. The write operation includes a data-in operation in which the controller 200 transfers data to the memory chip CP and the program operation in which the access circuit 110 writes data received by the data-in operation to the memory cell array 111.

A series of operations in which the controller 200 reads data from the memory chip CP is referred to as the read operation. The read operation includes the sense operation in which the access circuit 110 reads data from the memory cell array 111 and a data-out operation in which the controller 200 acquires data read by the sense operation from the memory chip CP.

Figure 3:
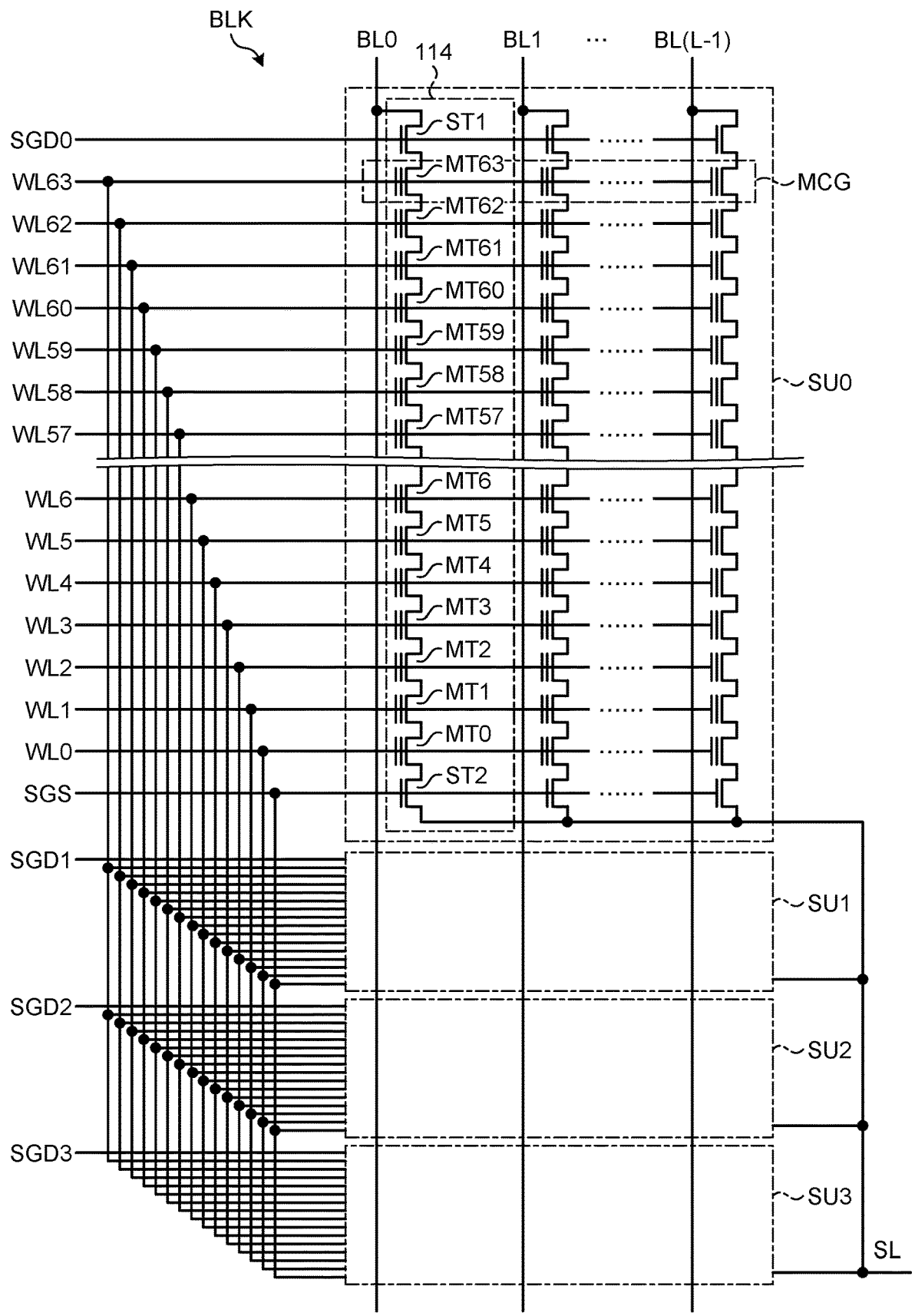
FIG. 3 is a diagram illustrating a circuit configuration of a block according to the embodiment.

FIG. 3 is a diagram illustrating a circuit configuration of the block BLK according to the embodiment. Each block BLK has the same configuration. The block BLK includes, for example, four string units SU0 to SU3. Each string unit SU includes a plurality of NAND strings 114.

Each of the NAND strings 114 includes, for example, sixty-four (64) memory cell transistors MT (MT0 to MT63) and selection transistors ST1 and ST2. Each of the memory cell transistors MT includes a control gate and a charge storage layer, and holds data in a non-volatile manner. The sixty-four memory cell transistors MT (MT0 to MT63) are connected in series between a source of the selection transistor ST1 and a drain of the selection transistor ST2. Note that the memory cell transistor MT may be a MONOS type using an insulating film for the charge storage layer, or may be an FG type using a conductive film for the charge storage layer. Moreover, the number of memory cell transistors MT in the NAND string 114 is not limited to sixty-four.

Gates of the selection transistors ST1 in the string units SU0 to SU3 are connected to selection gate lines SGD0 to SGD3, respectively. On the other hand, the gates of the selection transistors ST2 in the string units SU0 to SU3 are commonly connected to, for example, a selection gate line SGS. The gates of the selection transistors ST2 in the string units SU0 to SU3 may be connected to selection gate lines SGS0 to SGS3 different for each string unit SU. The control gates of the memory cell transistors MT0 to MT63 in the same block BLK are commonly connected to the word lines WL0 to WL63, respectively.

Drains of the selection transistors ST1 of the NAND strings 114 in the string unit SU are connected to different bit lines BL (BL0 to BL (L−1), where L is a natural number of two or more). In addition, the bit lines BL commonly connect one NAND string 114 in each string unit SU among the plurality of blocks BLK. Moreover, a source of each selection transistor ST2 is commonly connected to a source line SL.

In other words, the string unit SU is a set of NAND strings 114 connected to different bit lines BL and connected to the same selection gate line SGD. The block BLK is a set of a plurality of string units SU sharing the word line WL. The memory cell array 111 is a set of the plurality of blocks BLK sharing the bit lines BL.

The program operation and the sense operation on one plane by the access circuit 110 are collectively performed on the memory cell transistors MT connected to one word line WL in one string unit SU. Hereinafter, a group of the memory cell transistors MT selected collectively during the program operation and the sense operation on one plane is referred to as a "memory cell group MCG". A collection of one-bit data to be written or read in one memory cell group MCG is referred to as a "page".

The erase operation on one plane by the access circuit 110 can be performed in units of blocks BLK or in units smaller than the blocks BLK. An erase method is disclosed in, for example, U.S. patent application Ser. No. 13/235,389, entitled "NON-VOLATILE SEMICONDUCTOR MEMORY DEVICE" and filed on Sep. 18, 2011. In addition, the erase method is disclosed in U.S. patent application Ser. No. 12/694,690, entitled "NON-VOLATILE SEMICONDUCTOR STORAGE DEVICE" and filed on Jan. 27, 2010. Moreover, the erase method is disclosed in U.S. patent application Ser. No. 13/483,610, entitled "NON-VOLATILE SEMICONDUCTOR MEMORY DEVICE AND DATA ERASE METHOD THEREOF" and filed on May 30, 2012. The entire contents of these patent applications are incorporated herein by reference.

Note that one logical page is configured by a plurality of pages stored in different planes or different memory chips CP, and the controller 200 may instruct the program operation or the sense operation in parallel to the plurality of pages configuring one logical page. In addition, one logical block may be configured by a plurality of blocks BLK provided in different planes or different memory chips CP, and the controller 200 may instruct the erase operation in parallel to the plurality of blocks BLK configuring one logical block.

Hereinafter, the memory cell transistor MT is simply referred to as a memory cell.

Figure 4:
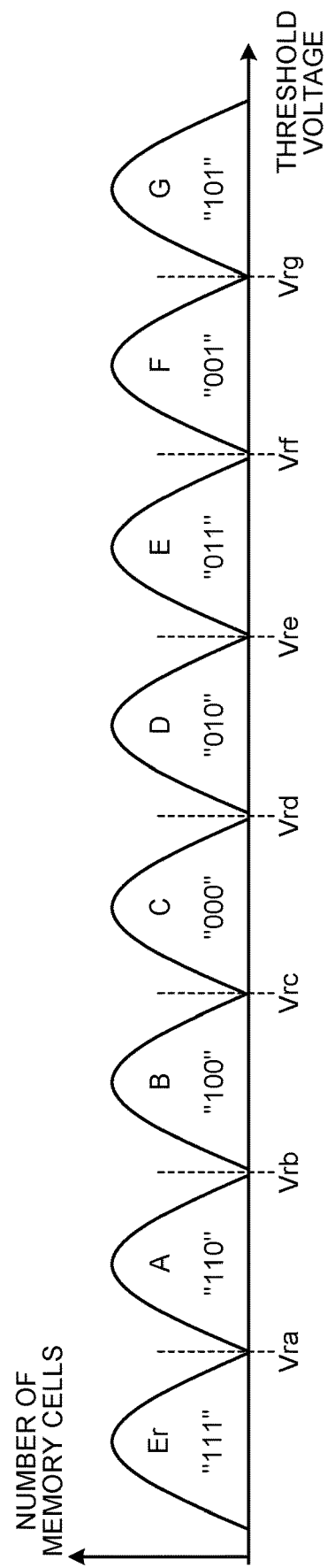
FIG. 4 is a diagram illustrating an example of a threshold voltage that can be taken by a memory cell according to the embodiment.

FIG. 4 is a diagram illustrating an example of the threshold voltage that can be taken by the memory cell according to the embodiment. The vertical axis represents the number of memory cells, and the horizontal axis represents the threshold voltage. In other words, FIG. 4 illustrates a distribution of the memory cells with respect to the threshold voltage. Hereinafter, in the present embodiment, a case where the memory cell can hold eight-value data will be described. However, the data that can be held is not limited to the eight-value data. In the present embodiment, the number of bits of data that can be held by the memory cell is optional as long as the memory cell can hold data of binary or more (data of one bit or more).

As illustrated in FIG. 4, a possible range of the threshold voltage is divided into eight ranges. These eight ranges are referred to as an "Er" state, an "A" state, a "B" state, a "C" state, a "D" state, an "E" state, an "F" state, and a "G" state in order from a lower threshold voltage. The threshold voltage of each memory cell is controlled by the access circuit 110 to belong to any of the "Er" state, the "A" state, the "B" state, the "C" state, the "D" state, the "E" state, the "F" state, and the "G" state. As a result, when the number of memory cells with respect to the threshold voltage is plotted, the memory cells ideally form eight lobe-like distributions that do not overlap each other and belong to different states, as illustrated in FIG. 4. Hereinafter, the distribution in each state may be simply referred to as a lobe.

The eight states correspond to three-bit data. According to the example in FIG. 4, the "Er" state corresponds to "111", the "A" state corresponds to "110", the "B" state corresponds to "100", the "C" state corresponds to "000", the "D" state corresponds to "010", the "E" state corresponds to "011", the "F" state corresponds to "001", and the "G" state corresponds to "101". In this manner, each memory cell can hold data corresponding to the state to which the threshold voltage belongs. Note that the correspondence between the states and data illustrated in FIG. 4 is an example of data coding. The data coding is not limited to the example illustrated in FIG. 4.

In the three-bit data held in one memory cell, a least significant bit (LSB) is referred to as a lower bit, a most significant bit (MSB) is referred to as an upper bit, and a bit between the LSB and the MSB is referred to as a middle bit. A set of lower bits of all the memory cell transistors MT belonging to the same memory cell group MCG is referred to as a lower page. A set of middle bits of all the memory cell transistors MT belonging to the same memory cell group MCG is referred to as a middle page. A set of upper bits of all the memory cell transistors MT belonging to the same memory cell group MCG is referred to as an upper page.

The threshold voltage is lowered to the "Er" state by the erase operation. In addition, the threshold voltage is maintained in the "Er" state or raised by the program operation until reaching any of the "A" state, the "B" state, the "C" state, the "D" state, the "E" state, the "F" state, and the "G" state.

Specifically, in the program operation, the access circuit 110 selects the bit line BL corresponding to the column address. The access circuit 110 sets a potential of a selected bit line BL to 0. The access circuit 110 selects the word line WL corresponding to a row address and applies a programming pulse to the selected word line WL. Then, electrons are injected into the charge storage layer of the memory cell located at an intersection of the selected bit line BL and the selected word line WL. As a result, the threshold voltage of the memory cell increases. The access circuit 110 reads data at a predetermined timing to check whether or not the threshold voltage of the memory cell has reached a target state corresponding to data of the write data (verify read). The access circuit 110 continues to apply a program pulse until the threshold voltage of the memory cell reaches the target state.

Hereinafter, the memory cell in which the threshold voltage is set to a given state by the program operation may be referred to as a memory cell belonging to the state.

A read voltage is set between two adjacent states. For example, as illustrated in FIG. 4, a read voltage Vra is set between the "Er" state and the "A" state, a read voltage Vrb is set between the "A" state and the "B" state, a read voltage Vrc is set between the "B" state and the "C" state, a read voltage Vrd is set between the "C" state and the "D" state, a read voltage Vre is set between the "D" state and the "E" state, a read voltage Vrf is set between the "E" state and the "F" state, and a read voltage Vrg is set between the "F" state and the "G" state. In the sense operation, the access circuit 110 determines data associated with the state, to which the memory cell belongs, by using a plurality of types of read voltages.

For example, a case where the data coding illustrated in FIG. 4 is applied will be described. When the memory cell belongs to any of the "Er" state, the "E" state, the "F" state, and the "G" state, a value of the lower bit held by the memory cell is "1". When the memory cell belongs to any of the "A" state, the "B" state, the "C" state, and the "D" state, the value of the lower bit held by the memory cell is "0". Therefore, the data of the lower page can be determined by using two types of read voltages Vra and Vre.

When the memory cell belongs to any of the "Er" state, the "A" state, the "D" state, and the "E" state, a value of the middle bit held by the memory cell is "1". When the memory cell belongs to any of the "B" state, the "C" state, the "F" state, and the "G" state, the value of the middle bit held by the memory cell is "0". Therefore, the data of the middle page can be determined by using three types of read voltages Vrb, Vrd, and Vrf.

When the memory cell belongs to any of the "Er" state, the "A" state, the "B" state, and the "G" state, a value of the upper bit held by the memory cell is "1". When the memory cell belongs to any of the "C" state, the "D" state, the "E" state, and the "F" state, the value of the upper bit held by the memory cell is "0". Therefore, the data of the upper page can be determined by using two types of read voltages Vrc and Vrg.

As described above, the type of the read voltage used to determine the data varies depending on a type of a target page of the sense operation. In the sense operation, the access circuit 110 uses a plurality of types of read voltages according to the type of the target page of the sense operation.

In FIG. 4, the case where the memory cells form the eight lobes that do not overlap each other has been described. However, the threshold voltage of the memory cell may change due to various factors. For example, the threshold voltage of the memory cell tends to change according to elapsed time from completion of the program operation. A speed of change of the threshold voltage of the memory cell is the fastest immediately after the completion of the program operation, and the speed decreases with the elapsed time. The threshold voltage is more likely to change in a memory cell with a larger number of executions of a cycle of the erase operation and the program operation. In addition, the change in the threshold voltage of the memory cell can be affected not only by the elapsed time from the completion of the program operation but also by the sense operation for the memory cell, the sense operation for an adjacent memory cell, a temperature at the time of access, and the like. Since the threshold voltage of the memory cell may change, two adjacent lobes may practically overlap each other during the sense operation.

Figure 5:
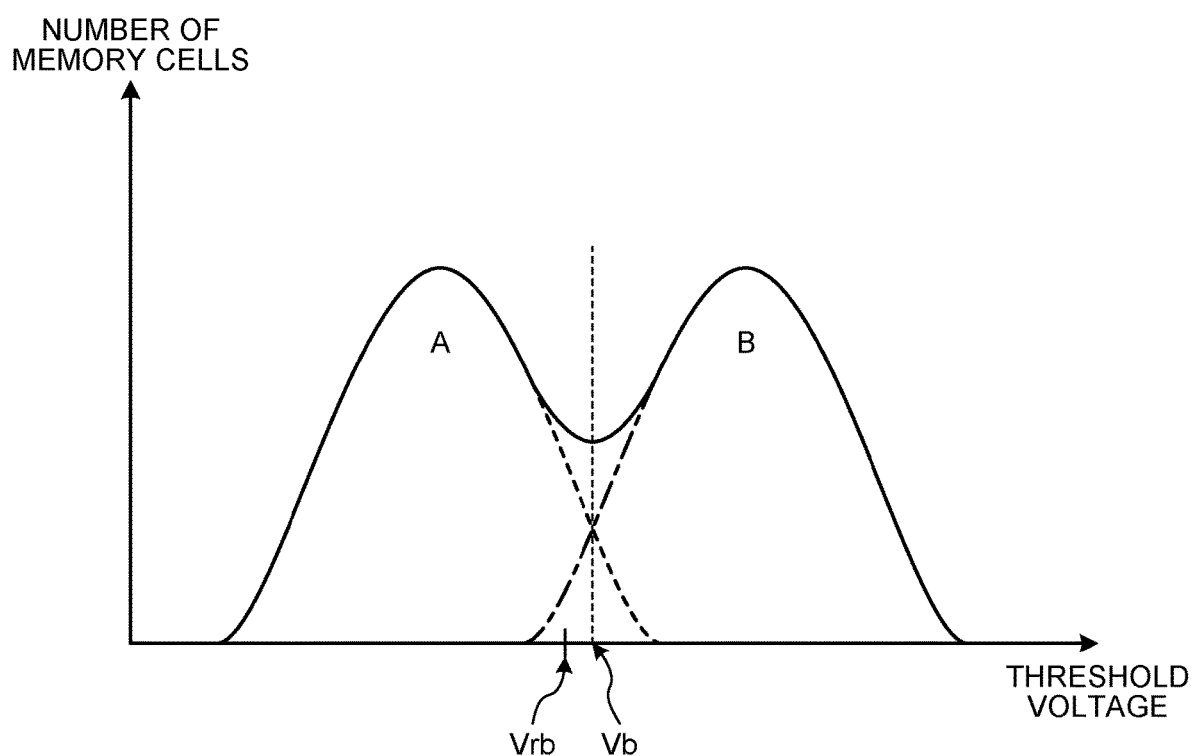
FIG. 5 is a diagram illustrating another example of the threshold voltage that can be taken by the memory cell according to the embodiment.

FIG. 5 is a diagram illustrating another example of the threshold voltage that can be taken by the memory cell according to the embodiment. In order to simplify the description, the distribution of memory cells belonging to either the "A" state or the "B" state is illustrated. A solid line indicates the distribution of memory cells belonging to either the "A" state or the "B" state. A dashed line indicates a lobe of the "A" state, and an alternate long and short dash line indicates a lobe of the "B" state. In the example in FIG. 5, an upper tail of the distribution of the "A" state and a lower tail of the distribution of the "B" state overlap. In other words, the maximum value of the threshold voltage of the memory cell belonging to the "A" state exceeds the read voltage Vrb, and the minimum value of the threshold voltage of the memory cell belonging to the "B" state is lower than the read voltage Vrb. When the memory cell that belongs to the "A" state and has the threshold voltage higher than the read voltage Vrb is read, the memory cell is recognized as belonging to the "B" state. In other words, data programmed as "110" is read as "100". When the memory cell that belongs to the "B" state and has the threshold voltage lower than the read voltage Vrb is read, the memory cell is recognized as belonging to the "A" state. In other words, data programmed as "100" is read as "110".

As described above, the data read by the sense operation may change from the value at the time of the program operation due to the change of the threshold voltage. The controller 200 handles the change of the data and the threshold voltage by error correction and shift of the read voltage. Specifically, in the controller 200, the ECC circuit 206 performs the error correction on the read data. When the error correction fails, the controller 200 changes the read voltage and executes the read operation again. Unsuccessful error correction means that the data before change cannot be restored from the data after change. Specifically, the unsuccessful error correction means that an error bit included in the read data cannot be corrected. Successful error correction means that all error bits included in the read data are corrected. The controller 200 performs retry reading until error correction is successful or the number of times the read operation is repeatedly executed reaches a predetermined number. In other words, the controller 200 repeats the read operation while changing the read voltage until the error correction is successful or the number of times the read operation is repeatedly executed reaches the predetermined number. The read operation with changing the read voltage is referred to as shift read.

The read voltage value can be expressed by various amounts. The read voltage value can also be indicated in various expressions. In the present embodiment, as an example, a reference value is set in advance for each type of the read voltage (Vra to Vrg), and the read voltage value is expressed by a shift amount that is a difference from the reference value. In addition, the reference value is recorded at a predetermined position in the memory chip CP for each type of read voltage. Then, the controller 200 instructs the memory chip CP with the shift amount from the reference value for each type of read voltage.

The methods of expressing and instructing the read voltage are not limited thereto. For example, the value of the read voltage may be expressed by the voltage value instead of the difference, and the read voltage may be instructed to the memory chip CP by the voltage value instead of the difference.

In the retry read, the controller 200 acquires the read voltage applied in the sense operation on the basis of a shift index table 220.

FIG. 6 is a diagram illustrating an example of a data structure of the shift index table 220 according to the embodiment. The shift index table 220 includes a plurality of entries, and one shift pattern is recorded in each entry. The shift pattern is a set of one value for each of all types of read voltages, and indicates a candidate value of the read voltage. The values of each type of read voltages included in each shift pattern are each expressed in the form of a shift amount from the reference value. In FIG. 6, a shift amount X (X is A, B, C, D, E, F, or G) indicates a difference of the read voltage Vrx (x is a, b, c, d, e, f, or g) from the reference value.

Each entry included in the shift index table 220 is distinguished by an index. Then, the shift pattern is recorded in each entry. The shift pattern recorded in each entry is a candidate value of the read voltage. In other words, the shift pattern is associated with an index value.

The index is also referred to as an ID. An entry whose index value is Y is also referred to as an entry IDY (Y is an integer of 0 or more). When some shift pattern is recorded in the entry IDY, the shift pattern is also referred to as a shift pattern of IDY. When some shift pattern is recorded in the entry IDY, an index Y is also referred to as an index of the shift pattern.

The shift pattern used in the initial state is recorded in an entry ID0. The shift pattern recorded in the entry ID0 and the shift pattern recorded in each entry from an entry ID3 to a last entry (referred to as entry IDI_last here) are fixed values. A plurality of shift patterns is recorded in the entries ID0 and ID3 to IDI_last in an order corresponding to a progress of a change of the threshold voltage. In other words, the index values 0 and 3 to I_last given to these entries indicate the order corresponding to the progress of the change of the threshold voltage.

For example, a first degree of change in the threshold voltage and a second degree of change in the threshold voltage, which is more than the first degree of change, are considered. The first shift pattern corresponding to the first degree is ranked higher than the second shift pattern corresponding to the second degree.

Therefore, theoretically, when the controller 200 repeats the shift read, when shift patterns are selected and sequentially applied in the order of entries ID0 and ID3 to IDI_last, it is possible to most efficiently find a shift pattern that can be read without failing in the error correction.

However, in the entries ID0 and ID3 to IDI_last, the shift patterns obtained by calculation or test by the manufacturer under possible use conditions are recorded. Therefore, when a use condition of the memory system 1 assumed by the manufacturer is different from an actual use condition of the memory system 1 by an end user, there is a case where a shift pattern that can be read without failing in error correction cannot be obtained even when the shift pattern is selected and applied in the order of the index values.

Therefore, in the embodiment, the shift pattern in a given entry is variably configured. Here, as an example, the shift patterns of the entry ID1 and the entry ID2 are variable. The controller 200 updates the shift pattern in the entry ID1 and the shift pattern in the entry ID2 according to the actual use condition.

Figure 7:
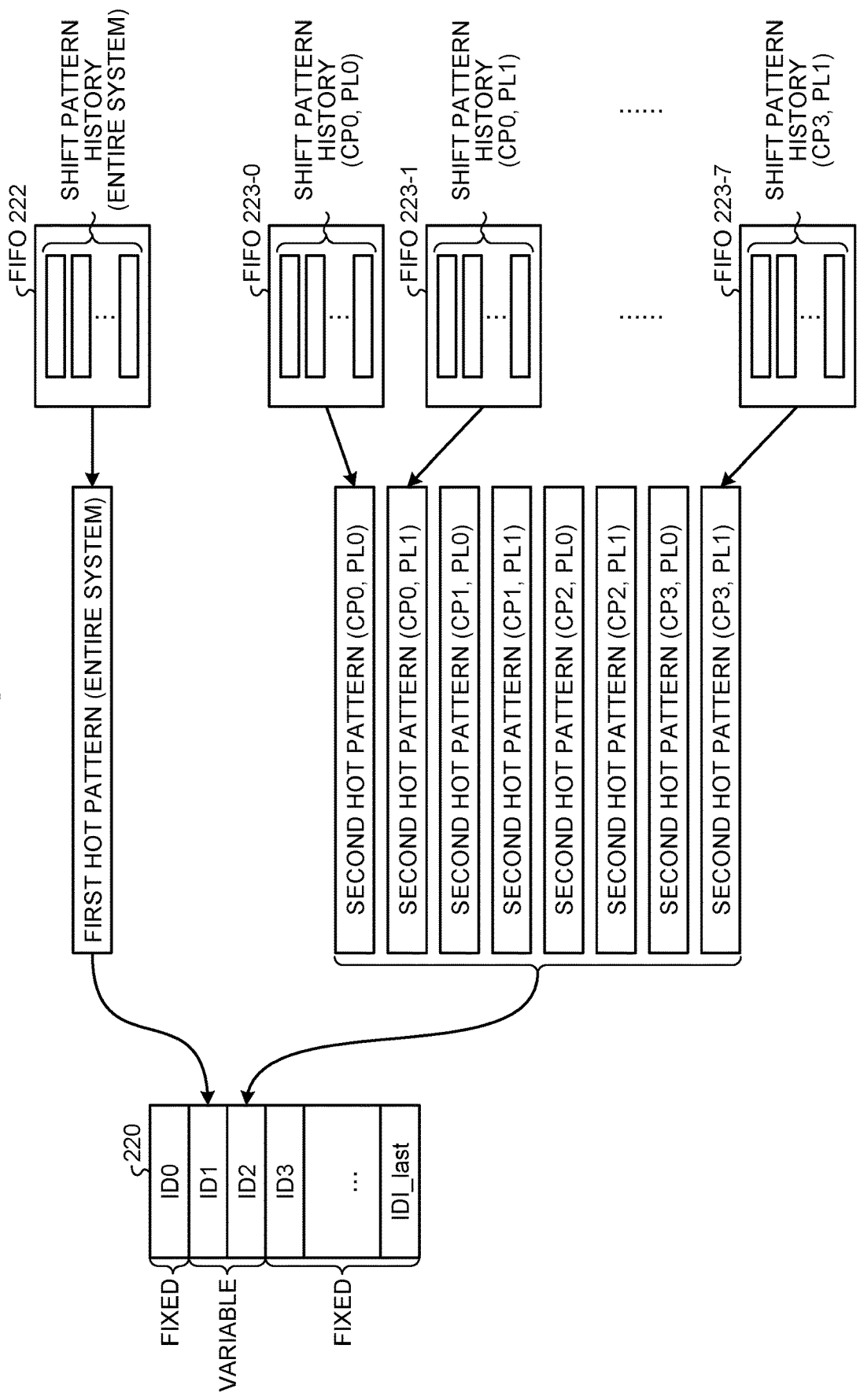
FIG. 7 is a diagram illustrating an example of a method of acquiring a shift pattern recorded in entries ID1 and ID2 of the shift index table according to the embodiment.

FIG. 7 is a diagram illustrating an example of a method of acquiring the shift patterns recorded in the entries ID1 and ID2 according to the embodiment.

The controller 200 can execute a shift pattern measurement operation of measuring the shift pattern that can suppress the number of error bits occurring in the read data. For convenience, the shift pattern capable of suppressing the number of error bits occurring in the read data is referred to as an optimum shift pattern. An example of the shift pattern measurement operation will be described later.

The controller 200 executes the shift pattern measurement operation using a predetermined condition as a trigger. The predetermined condition is, for example, unsuccessful error correction even when the shift read is performed a predetermined number of times in accordance with the shift index table 220. The trigger for starting the shift pattern measurement operation is not limited thereto.

The controller 200 stores the latest predetermined optimum shift patterns acquired by the shift pattern measurement operation in storage areas having a first-in first-out (FIFO) structure (namely, FIFO 222 and FIFO 223-0 to 223-7). In other words, the controller 200 stores the acquired history of the optimum shift pattern in the storage area of the FIFO structure. The controller 200 generates a new shift pattern on the basis of the history of the latest predetermined optimum shift pattern, and records the generated new shift pattern in the entry ID1 and ID2 in an overwriting manner. As a result, the shift patterns in the entries ID1 and ID2 are updated.

In the entry ID 1, the shift pattern generated on the basis of the optimum shift pattern acquired from the entire system, that is, all the memory chips CP included in the memory system 1, is recorded. In other words, when the shift pattern measurement operation is performed in the memory system 1, the controller 200 stores the optimum shift pattern obtained by the shift pattern measurement operation in the FIFO 222. Then, the controller 200 acquires a new shift pattern on the basis of all the optimum shift patterns stored in the FIFO 222, and records the new shift pattern in the entry ID1. The shift pattern recorded in the entry ID1 is referred to as a first hot pattern in a sense of one shift pattern dynamically generated after shipment of the memory system 1.

In the entry ID2, the shift patterns generated on the basis of the optimum shift pattern acquired in a range of each plane is recorded. In other words, the entry ID2 includes the shift pattern generated on the basis of the optimum shift pattern acquired from the plane 0 of the memory chip CP0, the shift pattern generated on the basis of the optimum shift pattern acquired from the plane 1 of the memory chip CP0, the shift pattern generated on the basis of the optimum shift pattern acquired from the plane 0 of the memory chip CP1, the shift pattern generated on the basis of the optimum shift pattern acquired from the plane 1 of the memory chip CP1, the shift pattern generated on the basis of the optimum shift pattern acquired from the plane 0 of the memory chip CP2, the shift pattern generated on the basis of the optimum shift pattern acquired from the plane 1 of the memory chip CP2, the shift pattern generated on the basis of the optimum shift pattern acquired from the plane 0 of the memory chip CP3, and the shift pattern generated on the basis of the optimum shift pattern acquired from the plane 1 of the memory chip CP3. As described above, the shift patterns are recorded in the entry ID2 for each combination of the memory chip CP and the plane.

In a case where the shift pattern measurement operation is performed on a given plane of a given memory chip CP, the controller 200 stores the optimum shift pattern obtained by the shift pattern measurement operation in the FIFO 223 of the FIFOs 223-0 to 223-7, which corresponds to the combination of the memory chip CP and the plane to be subjected to the shift pattern measurement operation. Then, the controller 200 acquires a new shift pattern on the basis of all the optimum shift patterns stored in the FIFO 223, and stores the new shift pattern in the entry ID2 of the shift index table 220 in association with the combination of the memory chip CP and the plane to be subjected to the shift pattern measurement operation. Each shift pattern recorded in the entry ID2 is referred to as a second hot pattern.

A tendency for the threshold voltage to change may be different for each memory chip CP. Also in the memory chip CP, a tendency for the threshold voltage to change may be different for each plane. Since the second hot pattern is individually generated for each combination of the memory chip CP and the plane, it is possible to generate, as the second hot pattern, a shift pattern that meets the tendency for the threshold voltage to change, which may be different for each memory chip CP or for each plane in the memory chip CP.

In the embodiment, a condition for updating the second hot pattern is further provided. The second hot pattern is updated only when the shift pattern is updated for the first time after the completion of the program operation.

As described above, the speed of change of the threshold voltage of the memory cell is the fastest immediately after the completion of the program operation. Therefore, in the period immediately after the completion of the program operation, an event of unsuccessful error correction is likely to occur in the read operation using the shift pattern indicated by the management ID. According to the embodiment, when the event occurs before the first update of the management ID after the completion of the program operation, the controller 200 acquires the optimum shift pattern and updates the second hot pattern on the basis of the acquired optimum shift pattern. Therefore, when the event of unsuccessful error correction occurs in the read operation using the shift pattern indicated by the management ID after the completion of the program operation in the same storage area or another storage area, a possibility of successful error correction can be increased by performing the read operation using the second hot pattern generated on the basis of the group of the optimum shift patterns collected under similar conditions.

When the shift read is repeated, the controller 200 sets the first hot pattern and the second hot pattern as use candidates in addition to the shift patterns of a plurality of entries selected in accordance with a predetermined rule out of the entries ID0 and ID3 to IDI_last. As a result, not only the shift patterns prepared in advance by the manufacturer but also the first hot pattern and the second hot pattern that are shift patterns generated on the basis of the optimum shift pattern acquired under the actual use environment by the end user are applied at the time of shift read. Therefore, it is possible to increase the possibility of successful error correction at the time of shift read.

Note that, here, as an example, the controller 200 preferentially selects the first hot pattern and the second hot pattern over the shift patterns recorded in the entries ID0 and ID3 to IDI_last. However, the controller 200 may not necessarily prioritize the first hot pattern and the second hot pattern.

The controller 200 further executes a patrol read. The patrol read is a read performed on the memory chip CP irrespective of a request from the host device 300. The patrol read is a read operation for the purpose of identifying in advance a shift pattern that will achieve successful error correction in order to increase a probability of successful error correction at the time of the read request from the host device 300. For example, the controller 200 executes the patrol read at a predetermined cycle. In response to the reception of the read request from the host device 300, the controller 200 may skip the execution of the patrol read or temporarily or non-temporarily change an execution cycle of the patrol read. In other words, the patrol read is executed multiple times at different timings irrespective of the read request from the host device 300.

In addition, the controller 200 sequentially switches the execution target of the patrol read in units of management area. The management area is a unit of a storage area in which one shift pattern is commonly used. For example, each block is a management area.

In the patrol read, the controller 200 learns the shift pattern for successful error correction. When executing the read operation in response to a request from the host device 300, the controller 200 uses the shift pattern obtained by learning. Hereinafter, an operation of reading data requested from the host device 300 is referred to as a host read.

Figures 8, 9:
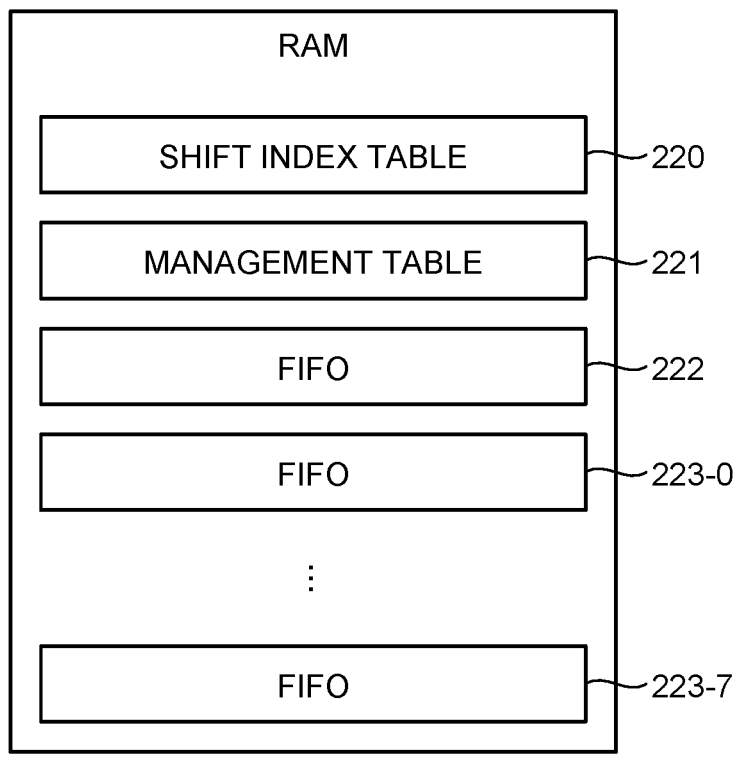
FIG. 8 is a diagram illustrating various types of data held in a RAM according to the embodiment.
FIG. 9 is a diagram illustrating a data configuration example of a management table according to the embodiment.

FIG. 8 is a diagram illustrating various types of data held in the RAM 202 according to the embodiment.

The RAM 202 stores the shift index table 220 and a management table 221 described above.

As described above, the shift index table 220 is information defining various shift patterns.

The contents of the fixed entries in the shift index table 220, namely, the entries ID0 and ID3 to IDI_last illustrated in FIG. 6 are stored in advance in a predetermined non-volatile storage area, for example, the NAND flash memory 100. The controller 200 loads the contents of the fixed entry in the shift index table 220 into the RAM 202 at the time of activation.

The controller 200 may periodically store the shift patterns recorded in the entry ID1 and the entry ID2 in the NAND flash memory 100 until the memory system 1 is shut down, and may load the shift patterns from the NAND flash memory 100 to the RAM 202 at the time of activation of the memory system 1. Alternatively, some or all of the shift patterns recorded in the entry ID1 and the entry ID2 may be lost at the time of power interruption.

The management table 221 is information in which shift patterns obtained by learning are recorded. The controller 200 records the index values of the shift patterns acquired by the patrol read in the management table 221. In the host read, the controller 200 refers to the management table 221 to determine the shift pattern to be used in the read operation including the shift read.

Similarly to the shift patterns recorded in the entry ID1 and the entry ID2, the management table 221 may be periodically or collectively stored in the NAND flash memory 100 until the memory system 1 is shut down, and may be loaded from the NAND flash memory 100 to the RAM 202 at the time of activation of the memory system 1. Alternatively, a part or all of the management table 221 may be lost at the time of power interruption.

The above-described FIFOs 222, 223-0 to 223-7 are allocated to the RAM 202.

Similarly to the shift patterns recorded in the entry ID 1 and the entry ID 2, the contents of the FIFOs 222, 223-0 to 223-7 may be periodically or collectively stored in the NAND flash memory 100 until the memory system 1 is shut down, and may be loaded from the NAND flash memory 100 to the RAM 202 at the time of activation of the memory system 1. Alternatively, some or all of the contents of the FIFOs 222, 223-0 to 223-7 may be lost at the time of power interruption.

FIG. 9 is a diagram illustrating a data configuration example of the management table 221 according to the embodiment.

The management table 221 manages the index value of the learned shift pattern for each management area. In the embodiment, as an example, the index value of the shift pattern is recorded in the management table 221. The index recorded in the management table 221 is referred to as a management ID.

In the embodiment, as an example, each block is the management area. In other words, when any page is read from one block, the shift pattern indicated by the management ID associated with the block is used.

Next, the shift pattern measurement operation will be described. First, a first shift pattern measurement operation will be described as an example of the shift pattern measurement operation. The first shift pattern measurement operation is also referred to as Vth tracking.

Figure 10:
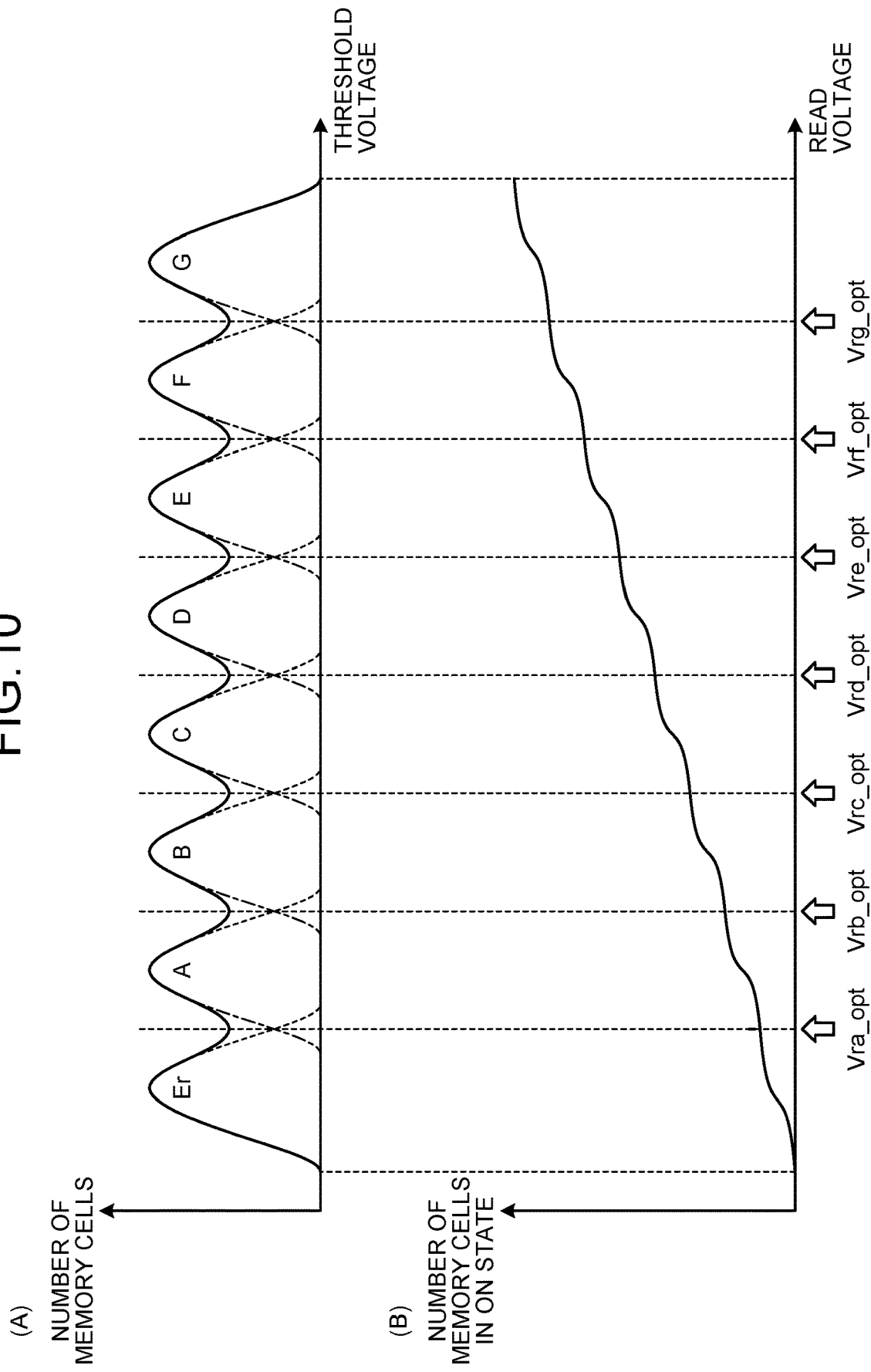
FIG. 10 is a diagram illustrating a first shift pattern measurement operation according to the embodiment.

FIG. 10 is a diagram illustrating the first shift pattern measurement operation. Part (A) of FIG. 10 illustrates an example of the distribution of the memory cells.

In the first shift pattern measurement operation, the controller 200 executes the read operation in a binary mode multiple times while varying the read voltage value for one word line selected by some method. The binary mode is a mode in which on/off of a memory cell is determined for each memory cell connected to a target word line by the sense operation performed using a single read voltage. In the data-out operation, the memory chip CP outputs data including a value corresponding to each memory cell for the memory cells connected to the target word line. For example, the data includes "1" for the memory cell in the ON state and "0" for the memory cell in the OFF state. Note that the value indicating the ON state and the value indicating the OFF state are not limited thereto.

The controller 200 counts the number of memory cells in the ON state or the OFF state on the basis of the data obtained by each read operation. Part (B) of FIG. 10 illustrates, as an example, a count result of the number of memory cells in the ON state.

Subsequently, the controller 200 calculates a change rate of the number of memory cells in the ON state on the basis of the number of memory cells in the ON state illustrated in Part (B) of FIG. 10. The change rate of the number of memory cells in the ON state is a change amount of the number of memory cells in the ON state when the read voltage is changed for a predetermined unit amount. When the change rate is plotted with respect to the read voltage, an approximation of the distribution of the memory cells with respect to the threshold voltage (that is, curve illustrated in Part (A) of FIG. 10) is obtained.

In the first shift pattern measurement operation, the controller 200 executes a plurality of read operations while increasing the value of the read voltage by Vstep for each read operation. The controller 200 calculates, as the change rate, the amount of change in the number of memory cells in the ON state when the value of the read voltage is increased by Vstep.

For each of the read voltages Vra to Vrg, the controller 200 acquires a read voltage value at which the change amount is minimum. Then, the controller 200 determines a set of read voltage values acquired, that is, a set of voltages Vra_opt to Vrg_opt in FIG. 10, as the optimum shift pattern.

In the first shift pattern measurement operation, the controller 200 executes a plurality of read operations while increasing the read voltage value by Vstep. A change range of the read voltage may cover the entire range that can be taken by the threshold voltage of the memory cell, or may cover only a range near a specific voltage value (for example, a range that can be taken by each of the read voltages Vra to Vrg).

Figure 11:
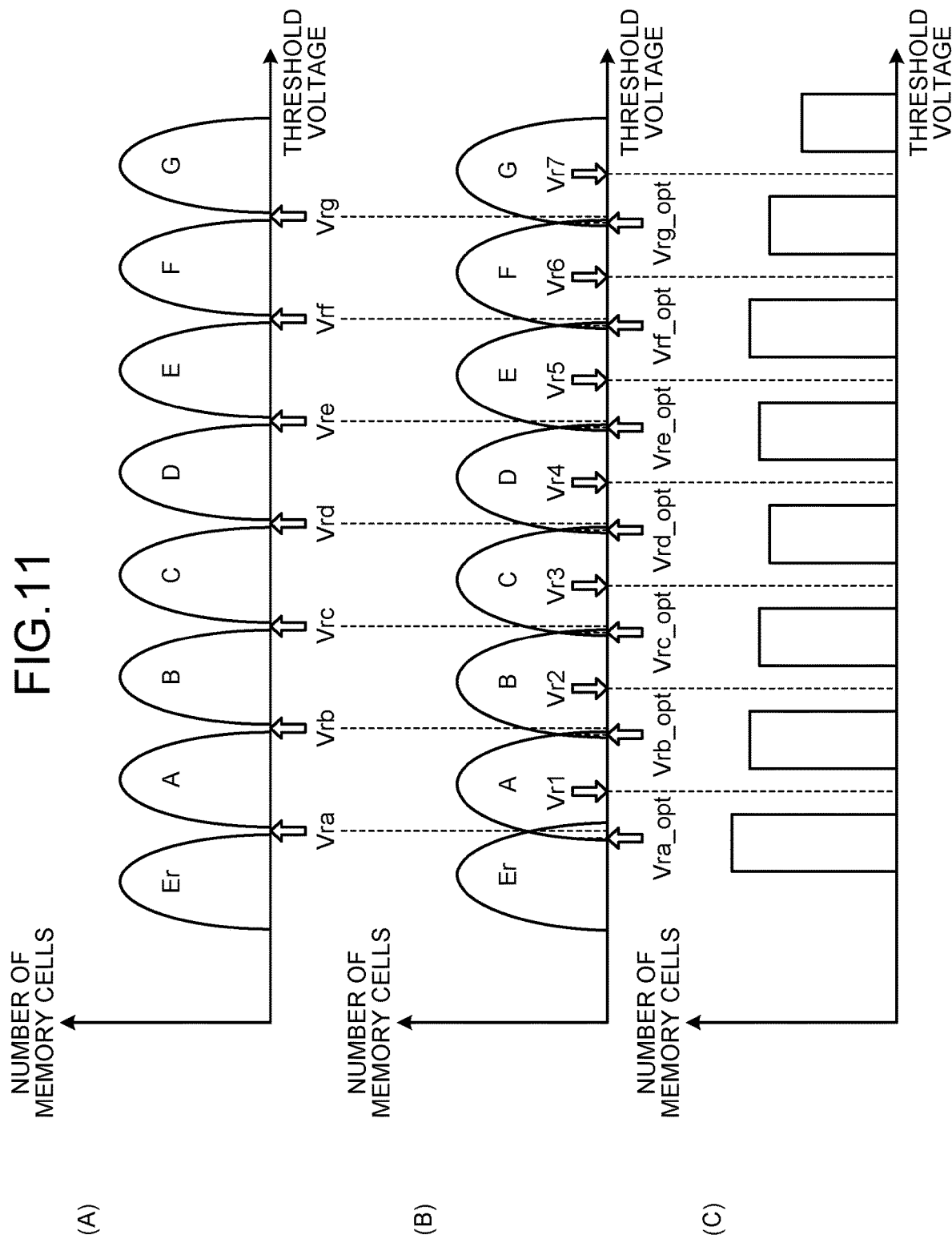
FIG. 11 is a diagram illustrating an operation of acquiring a histogram in a second shift pattern measurement operation according to the embodiment.
Figure 12:
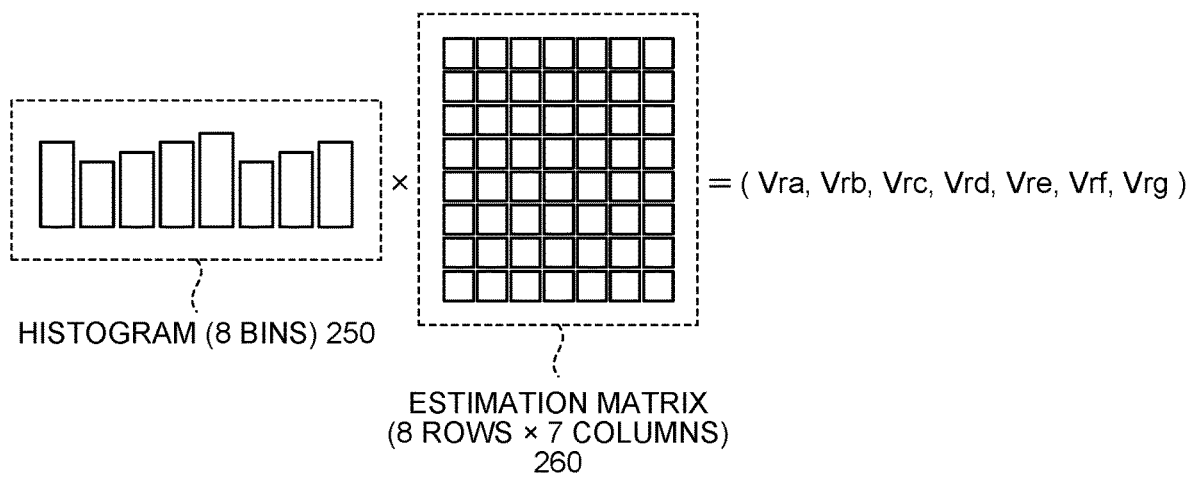
FIG. 12 is a diagram illustrating a configuration example of an estimation function used in the second shift pattern measurement operation according to the embodiment.

As another example of the shift pattern measurement operation, a second shift pattern measurement operation will be described. FIGS. 11 and 12 are diagrams illustrating the second shift pattern measurement operation.

In each of three graphs included in FIG. 11, the vertical axis represents the number of memory cells, and the horizontal axis represents the threshold voltage.

Part (A) of FIG. 11 illustrates the distribution of the memory cells immediately after the program operation. Immediately after the program operation, for example, as illustrated in the drawing, the lobe in one state is separated from the lobe in adjacent states.

Part (B) of FIG. 11 illustrates a distribution of memory cells obtained after the memory system 1 is used for a while after the program operation is completed. As illustrated in the drawing, eight lobes are different in shape and position from eight lobes illustrated in Part (A) of FIG. 11. Skirts of the eight lobes overlap to form one continuous distribution. When this distribution is obtained, it is considered that seven minimum points included in the distribution, that is, a set of Vra_opt, Vrb_opt, Vrc_opt, Vrd_opt, Vre_opt, Vrf_opt, and Vrg_opt corresponds to the optimum shift pattern in the state of Part (B) of FIG. 11.

In the example in Part (B) of FIG. 11, seven reference voltages Vr1, Vr2, Vr3, Vr4, Vr5, Vr6, and Vr7 are set in advance. The controller 200 executes the read operation in the binary mode using each of the reference voltages Vr1, Vr2, Vr3, Vr4, Vr5, Vr6, and Vr7. In other words, the controller 200 acquires data indicating ON/OFF of each memory cell from one word line of the memory chip CP for each reference voltage by executing seven read operations. The controller 200 calculates a difference between the number of memory cells in the ON state (or the number of memory cells in the OFF state) obtained by the read operation using the reference voltage Vri (where i is an integer from 1 to 7) and the number of memory cells in the ON state (or the number of memory cells in the OFF state) obtained by the read operation using the reference voltage Vri+1 to generate a histogram in which eight sections divided by the reference voltages Vr1, Vr2, Vr3, Vr4, Vr5, Vr6, and Vr7 are bins and the number of memory cells is a frequency.

For example, when the number of memory cells in the ON state is denoted by Ci in a case where the reference voltage Vri is used as the read voltage and the number of memory cells connected to the target word line is denoted by Cmt, the frequency of the section divided by Vrj and Vr (j+1) can be obtained by the operation of C (j+1)−Cj. Note that j is an integer from 1 to 6. The frequency of the section smaller than Vr1 is C1. The frequency of the section larger than Vr7 is Cmt−C7.

Part (C) of FIG. 11 is a diagram illustrating a histogram obtained by the above processing.

Note that the reference voltages Vr1 to Vr7 are set in advance. A method of setting the reference voltages Vr1 to Vr7 is not limited to a specific method.

For example, reference values of the read voltages Vra to Vrg are determined in advance, and the controller 200 may set the read voltages using differences from the reference values. In this case, the reference values of the seven read voltages Vra to Vrg may be used as the seven reference voltages Vr1 to Vr7.

In the example in FIG. 11, the number of reference voltages is equal to the number of read voltages Vra to Vrg. However, the number of reference voltages may be different from the number of read voltages Vra to Vrg. For example, the number of reference voltages may be three, and the controller 200 may generate a histogram having four bins using the three reference voltages.

The controller 200 acquires the optimum shift pattern by applying an estimation matrix prepared in advance to the histogram acquired by the seven read operations using the reference voltage.

FIG. 12 is a diagram illustrating a configuration example of an estimation matrix according to the embodiment. In the example in FIG. 12, an estimation matrix 260 includes eight rows and seven columns. The number of rows in the estimation matrix 260 is equal to the number of bins constituting the histogram (histogram 250) obtained by the plurality of read operations using the reference voltage. The number of columns of the estimation matrix 260 is equal to the number of voltages constituting the optimum shift pattern. The controller 200 operates a vector having seven elements by multiplying the estimation matrix 260 from the right side of the vector having a value (frequency) of each bin of the histogram 250 as an element. The seven elements configuring the vector correspond to estimated optimum read voltage values Va to Vg.

The estimation matrix 260 is generated, for example, as follows.

A large number of pairs of the histogram and the set of optimum values of the seven read voltages Vra to Vrg are acquired from one or more samples of the memory chip CP while variously changing a stress condition of the memory chip CP. For example, one or more samples of the memory chip CP are connected to a test device, and the test device performs a test simulating an actual use of the memory system 1.

In the test, an access pattern or the like is made different, so that each sample is brought into a different state in terms of the stress condition such as the number of executions of cycles of the program operation and the erase operation and the number of executions of the read operation. The test device acquires a histogram in each state.

In other words, the test device causes the memory chip CP to sequentially apply the reference voltages Vr 1, Vr2, Vr3, Vr4, Vr5, Vr6, and Vr7 to the target word line, and determines whether each memory cell is in the ON state or the OFF state for each reference voltage. The test device counts the number of memory cells in the ON state (or the number of memory cells in the OFF state) out of the plurality of memory cells connected to the target word line for each reference voltage. Then, the test device generates a histogram in which eight sections divided by the reference voltages Vr 1, Vr2, Vr3, Vr4, Vr5, Vr6, and Vr7 are bins and the number of memory cells is a frequency on the basis of count values obtained for each reference read voltage.

The test device acquires an optimum shift pattern when acquiring the histogram from the sample. A method of obtaining the optimum shift pattern is not limited to a specific method. The optimum shift pattern can be obtained, for example, by performing the first shift pattern measurement operation.

The test device outputs the histogram and the set of optimum shift patterns acquired when the histogram is acquired.

Pairs of the histogram and the set of optimum shift patterns are collected as described above, and the estimation matrix 260 that associates the histogram with the set of optimum shift patterns is generated by using a large number of the collected pairs. In other words, the estimation matrix 260 is a regression model using the histogram as an explanatory variable and a set of optimum shift patterns as an objective variable.

In the second shift pattern measurement operation, the optimum shift pattern is obtained using the estimation matrix 260 generated by the method as described above. Note that the method of generating the estimation matrix 260 is not limited to the above method.

As described above, in the second shift pattern measurement operation, the controller 200 executes the plurality of read operations in the binary mode while switching the value of the read voltage from among the plurality of reference voltages. Then, the controller 200 acquires the histogram indicating the number of memory cells with respect to the threshold voltage on the basis of the results of the plurality of read operations. Then, the controller 200 acquires the optimum value of the read voltages Vra to Vrg, that is, the optimum shift pattern on the basis of the acquired histogram and the estimation matrix 260.

As described above, any shift pattern measurement operation requires execution of multiple read operations. Therefore, when the shift pattern measurement operation is activated during the host read, a read latency is deteriorated.

In the embodiment, when the shift pattern measurement operation is executed, the first hot pattern, the second hot pattern, or the both are updated on the basis of the optimum shift pattern obtained by the shift pattern measurement operation, and each updated hot pattern can be used in the shift read using a subsequent shift index table 220. Since each hot pattern obtained under the actual use condition of the memory system 1 by the end user can be used in the shift read using the shift index table 220, the possibility of generating error correction in the shift read using the shift index table 220 is improved. As a result, a frequency of activation of the shift pattern measurement operation can be suppressed. In other words, it is possible to reduce deterioration of the read latency caused by the shift pattern measurement operation.

Next, an operation of the memory system 1 of the embodiment will be described.

Figure 13:
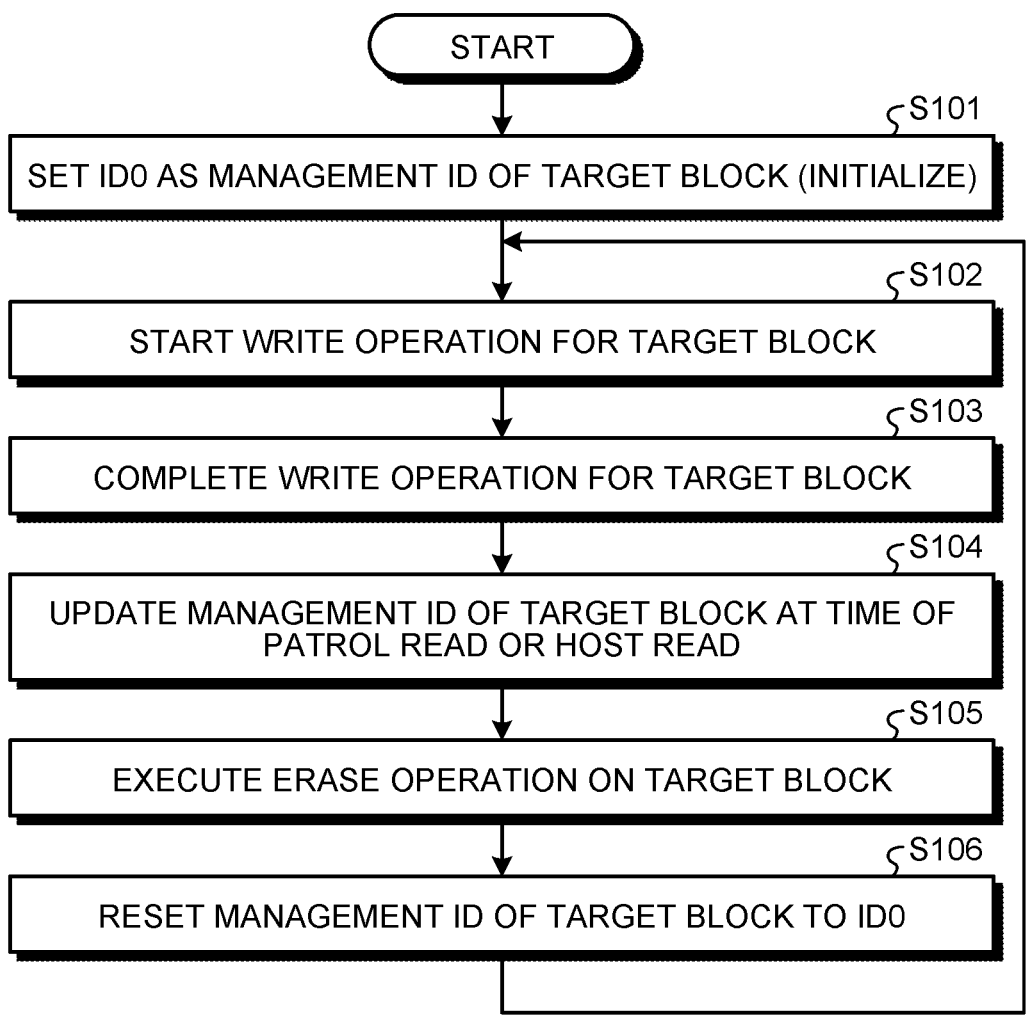
FIG. 13 is a flowchart illustrating a typical operation example for one block by a controller according to the embodiment.

FIG. 13 is a flowchart illustrating a typical operation example for one block by the controller 200 according to the embodiment. Here, it is assumed that the management table 221 is not stored in the NAND flash memory 100, and the management table 221 is lost due to shutdown of the memory system 1. Moreover, the description of FIG. 13 focuses on one block that is referred to as a target block. Note that the controller 200 can execute the operation illustrated in FIG. 13 on all the blocks.

When the memory system 1 is activated, the controller 200 generates the management table 221 in which ID0 is recorded as the management ID of all the management areas (namely, blocks), and stores the generated management table 221 in the RAM. In other words, the controller 200 sets ID0 as the management ID of the target block as initialization processing immediately after the activation of the memory system 1 (S101).

The controller 200 starts the write operation for the target block (S102). Note that the write operation is executed in units of pages. The write operation for the target block is completed (S103) by, for example, the target block being full of data. In other words, the program operation for all the word lines included in the target block is completed.

The controller 200 executes the patrol read or the host read on the target block. The controller 200 can update the management ID of the target block at the time of patrol read or host read (S104).

Then, when the erase operation is performed on the target block (S105), the controller 200 resets the management ID of the target block to ID0 (S106). Then, the control proceeds to S102.

Figure 14:
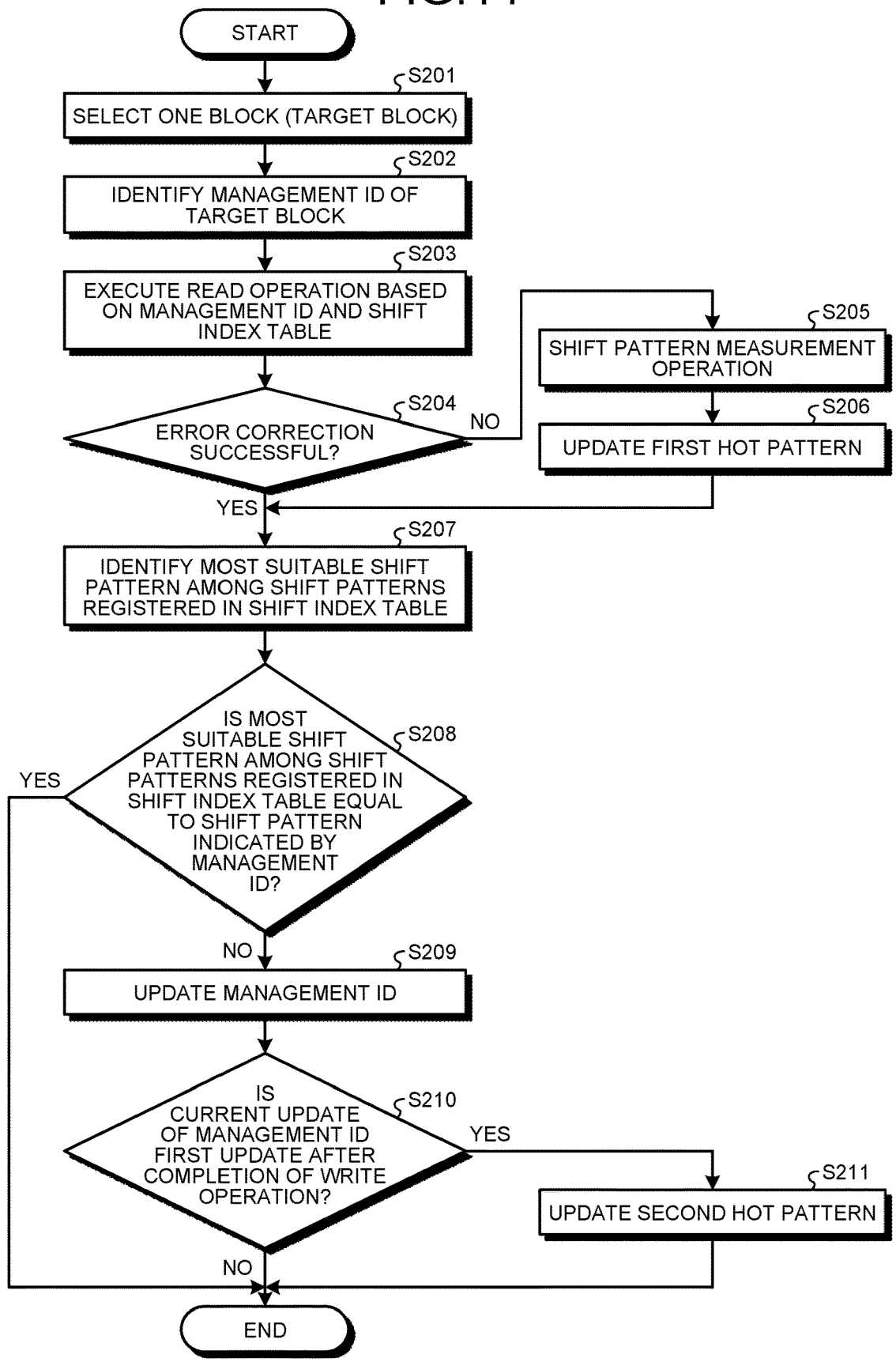
FIG. 14 is a flowchart illustrating an example of a patrol read operation according to the embodiment.

FIG. 14 is a flowchart illustrating an example of the operation of the patrol read of the embodiment.

First, the controller 200 selects one block (S201). The block selected in S201 is referred to as a target block in the description of FIG. 14.

The controller 200 refers to the management table 221 to identify the management ID of the target block (S202). Then, the controller 200 executes, on the target block, the read operation that is based on the management ID and the shift index table 220 (S203). Note that a method of selecting a page to be read is not limited to a specific method.

Figure 15:
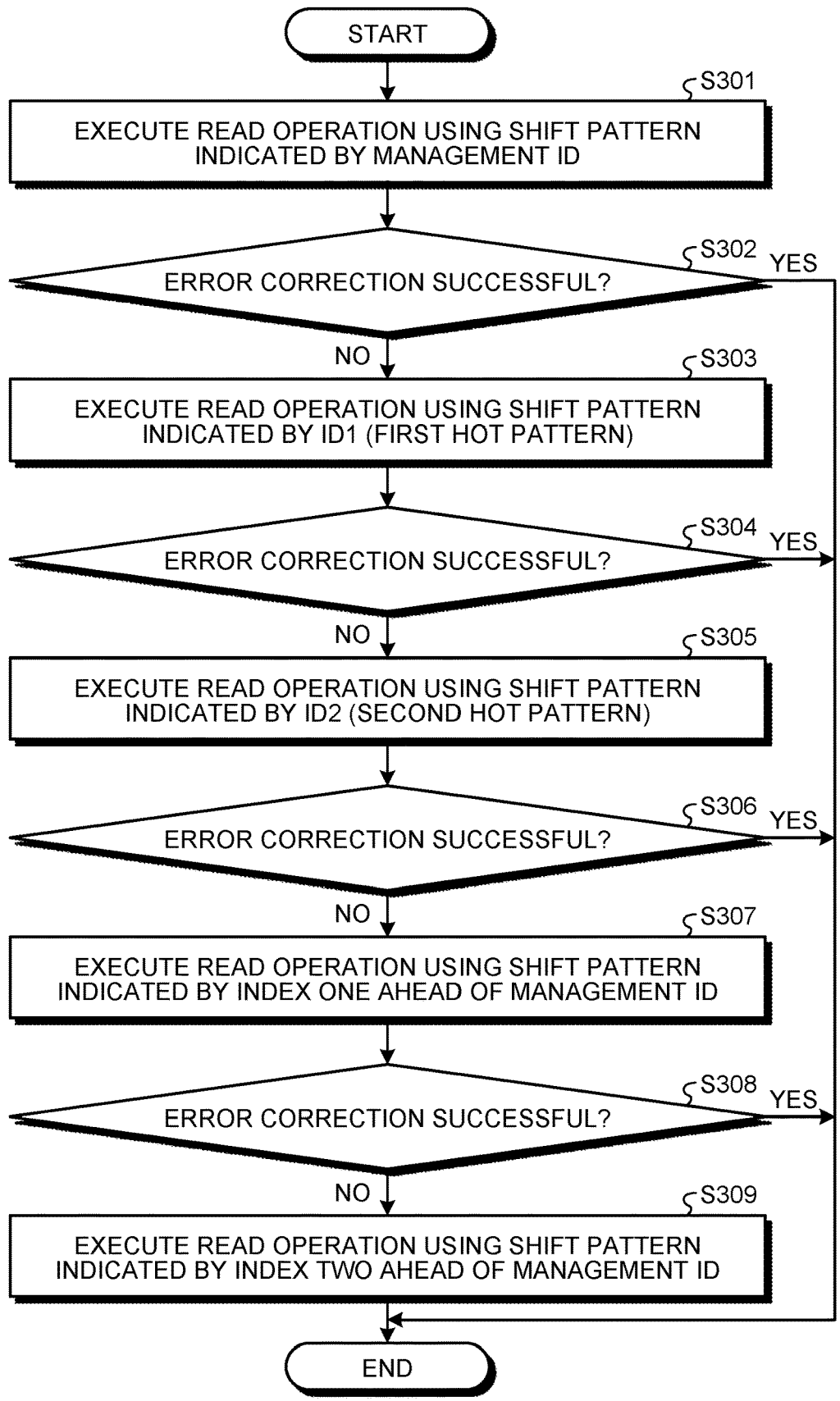
FIG. 15 is a flowchart illustrating an example of a read operation based on a management ID and a shift index table according to the embodiment.

FIG. 15 is a flowchart illustrating an example of the read operation, that is, the processing of S203 in FIG. 14, based on the management ID and the shift index table 220 according to the embodiment.

First, the controller 200 executes the read operation using the shift pattern indicated by the management ID (S301).

Then, the controller 200 determines whether or not the error correction is successful for the read data acquired by the processing of S301 (S302). When the error correction is successful (S302: Yes), the read operation based on the management ID and the shift index table 220 is completed.

When the error correction fails (S302: No), the controller 200 executes the read operation using the shift pattern indicated by ID1, namely, the first hot pattern (S303). Then, the controller 200 determines whether or not the error correction is successful for the read data acquired by the processing of S303 (S304). When the error correction is successful (S304: Yes), the read operation based on the management ID and the shift index table 220 is completed.

When the error correction fails (S304: No), the controller 200 executes the read operation using the shift pattern indicated by ID2, namely, the second hot pattern (S305). The controller 200 executes the read operation using the second hot pattern corresponding to the combination of the memory chip CP and plane, to which the block selected by the processing of S201 in FIG. 14 belongs, out of the eight second hot patterns indicated by ID2. The controller 200 determines whether or not the error correction is successful for the read data acquired by the processing of S305 (S306). When the error correction is successful (S306: Yes), the read operation based on the management ID and the shift index table 220 is completed. Here, as an example, the first hot pattern and the second hot pattern are applied in this order. An order of application of the first hot pattern and the second hot pattern is not limited to the order described above.

When the error correction fails (S306: No), the controller 200 executes the read operation using the shift pattern indicated by the index one ahead of the management ID (S307). Then, the controller 200 determines whether or not the error correction is successful for the read data acquired by the processing of S307 (S308). When the error correction is successful (S308: Yes), the read operation based on the management ID and the shift index table 220 is completed.

When the error correction fails (S308: No), the controller 200 executes the read operation using the shift pattern indicated by the index two ahead of the management ID (S309). Then, the read operation based on the management ID and the shift index table 220 is completed.

In the example illustrated in FIG. 15, when error correction fails in the first read operation, the controller 200 changes the shift pattern up to three times on the basis of the shift index table 220. The number of times the shift pattern can be changed is not limited to three.

The description returns to FIG. 14. The controller 200 determines whether or not error correction is successful during the operation of S203 (S204). In other words, the controller 200 determines whether or not the read data not including an error is obtained by any of the read operations executed in the operation of S203.

When the error correction is not successful (S204: No), the controller 200 executes the shift pattern measurement operation (S205). For example, the controller 200 executes the first shift pattern measurement operation or the second shift pattern measurement operation described above.

The controller 200 updates the first hot pattern on the basis of the optimum shift pattern acquired by the operation of S205 (S206).

In S206, the controller 200 inputs the acquired optimum shift pattern to the FIFO 222. As a result, the oldest optimum shift pattern stored in the FIFO 222 is deleted from the FIFO 222. The controller 200 calculates an average value of all the optimum shift patterns in the FIFO 222 for each of the read voltages Vra to Vrg. Then, the controller 200 records the acquired set of average values as a new first hot pattern in the entry ID1 in the overwriting manner.

Subsequently, the controller 200 identifies the most suitable shift pattern from among the shift patterns recorded in the shift index table 220 (S207).

For example, the controller 200 sets the shift pattern most similar to the optimum shift pattern acquired by the operation of S205 as the most suitable shift pattern out of the shift patterns recorded in the shift index table 220. Note that an optional index can be used as an index of similarity between two shift patterns. For example, the Euclidean distance or cosine similarity may be used.

When the error correction is successful in the determination processing of S204 (S204: Yes), the controller 200 sets the shift pattern, which is used when the error correction is successful and used in the series of operations illustrated in FIG. 15, as the most suitable shift pattern of the shift patterns recorded in the shift index table 220 in S207.

When the most suitable shift pattern of the shift patterns recorded in the shift index table 220 is equal to the shift pattern indicated by the current management ID (S208: Yes), the controller 200 ends the patrol read for the target block.

When the most suitable shift pattern of the shift patterns recorded in the shift index table is different from the shift pattern indicated by the current management ID (S208: No), the controller 200 updates the management ID (S209). In other words, the controller 200 overwrites the management ID with the index of the most suitable shift pattern of the shift patterns recorded in the shift index table 220.

Then, the controller 200 determines whether or not the current update of the management ID is the first update after the completion of the write operation for the target block (S210). The first update after completion of the write operation for the target block refers to update of the management ID in which S104 is executed for the first time after S103 in FIG. 13.

When the update of the management ID is the first time after completion of the write operation for the target block (S210: Yes), the controller 200 updates the second hot pattern (S211).

For example, when the controller 200 has already executed S205, in S211, the controller 200 inputs the optimum shift pattern acquired by the processing of S205 to the FIFO 223 corresponding to the combination of the memory chip CP and plane to which the target block belongs, of the FIFOs 223-0 to 223-7 corresponding to the eight second hot patterns indicated by the ID2. As a result, the oldest optimum shift pattern stored in the FIFO 223 is deleted from the FIFO 223. The controller 200 calculates an average value of all shift patterns in the FIFO 223 for each of the read voltages Vra to Vrg. Then, the controller 200 records the obtained set of average values as a new second hot pattern in the overwriting manner in the second hot pattern corresponding to the combination of the memory chip CP and plane to which the target block belongs, of the eight second hot patterns indicated by the ID 2.

When the controller 200 determines Yes in the determination processing of S204, the controller 200 inputs, in S211, the shift pattern indicated by the updated management ID to the FIFO 223 corresponding to the combination of the memory chip CP and plane to which the target block belongs, of the FIFOs 223-0 to 223-7 corresponding to the eight second hot patterns indicated by the ID2. As a result, the oldest optimum shift pattern stored in the FIFO 223 is deleted from the FIFO 223. The controller 200 calculates an average value of all shift patterns in the FIFO 223 for each of the read voltages Vra to Vrg. Then, the controller 200 records the obtained set of average values as a new second hot pattern in the overwriting manner in the second hot pattern corresponding to the combination of the memory chip CP and plane to which the target block belongs, of the eight second hot patterns indicated by the ID 2.

When the current update of the management ID is not the first update after the completion of the write operation for the target block (S210: No), or after S211, the controller 200 ends the patrol read for the target block.

As described above, when the shift pattern measurement operation is activated in the patrol read, the controller 200 updates the first hot pattern using the optimum shift pattern acquired by the shift pattern measurement operation and updates the management ID. Then, when the management ID is updated for the first time after completion of the write operation, the controller 200 also updates the second hot pattern using the optimum shift pattern acquired by the shift pattern measurement operation.

Figure 16:
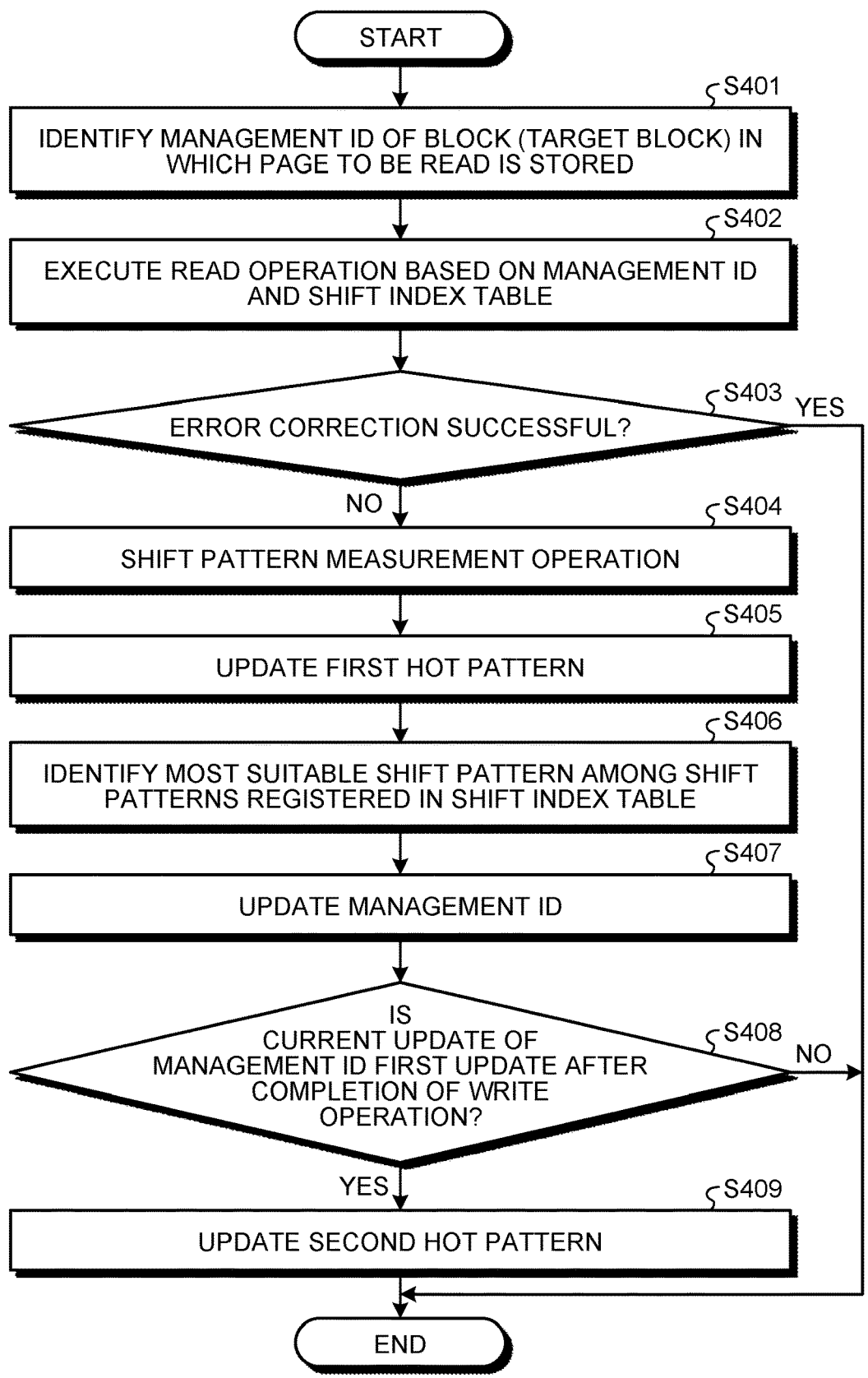
FIG. 16 is a flowchart illustrating an example of an operation of a host read according to the embodiment.

FIG. 16 is a flowchart illustrating an example of operation of the host read according to the embodiment.

First, the controller 200 refers to the management table 221 to identify the management ID of the block in which the page to be read is stored (S401). A block in which a read target page is stored will be referred to as a target block in the description of FIG. 16.

The controller 200 executes the read operation on the target block on the basis of the management ID and the shift index table 220 (S402). In S402, for example, the controller 200 executes the operation illustrated in FIG. 15.

Subsequently, the controller 200 determines whether or not error correction is successful during the operation of S402 (S403). In other words, the controller 200 determines whether or not the read data not including an error is obtained by any read operation executed in the operation of S402.

When the error correction is successful (S403: Yes), the controller 200 transmits the read data to the host device 300, and the host read ends.

When the error correction is not successful (S403: No), the controller 200 executes the shift pattern measurement operation (S404). For example, the controller 200 executes the first shift pattern measurement operation or the second shift pattern measurement operation.

At this time, the controller 200 can execute the read operation using the optimum shift pattern acquired by the operation of S404, and transmit the obtained read data to the host device 300.

Subsequently, the controller 200 updates the first hot pattern on the basis of the optimum shift pattern acquired by the operation of S404 (S405). Then, the controller 200 identifies the most suitable shift pattern of the shift patterns recorded in the shift index table 220 (S406).

Similarly to the processing of S207, for example, the controller 200 sets the shift pattern most similar to the optimum shift pattern acquired by the operation of S404 as the most suitable shift pattern of the shift patterns recorded in the shift index table 220.

Subsequently, the controller 200 updates the management ID (S407). In other words, the controller 200 overwrites the management ID with the index of the most suitable shift pattern of the shift patterns recorded in the shift index table.

Subsequently, the controller 200 determines whether or not the current update of the management ID is the first update after the completion of the write operation for the target block (S408).

When the management ID is updated for the first time after the completion of the write operation for the target block (S408: Yes), the controller 200 updates the second hot pattern (S409).

For example, the controller 200 inputs the optimum shift pattern acquired by the processing of S404 to the FIFO 223 corresponding to the combination of the memory chip CP and plane to which the target block belongs, of the FIFOs 223-0 to 223-7 corresponding to the eight second hot patterns indicated by ID2. As a result, the oldest optimum shift pattern stored in the FIFO 223 is deleted from the FIFO 223. The controller 200 calculates an average value of all shift patterns in the FIFO 223 for each of the read voltages Vra to Vrg. Then, the controller 200 records the obtained set of average values as a new second hot pattern in the overwriting manner in the second hot pattern corresponding to the combination of the memory chip CP and plane to which the target block belongs, of the eight second hot patterns indicated by the ID 2.

When the management ID is not updated for the first time after the completion of the write operation for the target block (S408: No), or after S409, the host read ends.

As described above, according to the embodiment, the controller 200 executes the read operation on a given block in the patrol read or the host read (for example, S203 in FIG. 14 or S402 in FIG. 16) and executes the error correction. When the error correction fails (for example, No in S204 in FIG. 14 or No in S403 in FIG. 16), the controller 200 executes the shift pattern measurement operation (for example, S205 in FIG. 14 or S404 in FIG. 16). As described with reference to FIGS. 10 to 12, in the shift pattern measurement operation, the controller 200 determines ON/OFF of the memory cell multiple times with different read voltage values, and acquires, as the optimum shift pattern, a set of read voltage values for suppressing the number of occurrence of error bits on the basis of a group of determination results. Then, the controller 200 updates the shift pattern corresponding to the index of the predetermined value (for example, shift pattern of entry ID1 or entry ID2) on the basis of the optimum shift pattern (for example, S206 and S211 in FIG. 14 or S405 and S409 in FIG. 16). Thereafter, the controller 200 executes the read operation on a given block in the patrol read or the host read (for example, S301 in FIG. 15), and executes the error correction. When the error correction fails (for example, No in S302 in FIG. 15), the controller 200 executes the shift read once or more while changing the read voltage on the basis of the shift index table 220 (for example, S303 to S309 in FIG. 15).

Since each hot pattern obtained under the actual use condition of the memory system 1 by the end user can be used in the shift read using the shift index table 220, the possibility of generating error correction in the shift read using the shift index table 220 is improved. As a result, a frequency of activation of the shift pattern measurement operation can be suppressed. In other words, it is possible to reduce deterioration of the read latency caused by the shift pattern measurement operation.

In addition, according to the embodiment, the controller 200 executes the shift read measurement operation when the error correction is not successful during the patrol read performed periodically and the shift read performed for a predetermined number of times in the host read in response to a read request from the host device 300. Therefore, the controller 200 executes the shift read measurement operation multiple times at different timings. The controller 200 stores the optimum shift pattern acquired by the plurality of measurement operations in the FIFOs 222 and 223. The controller 200 generates the first hot pattern or the second hot pattern on the basis of the group of optimum shift patterns stored in the FIFOs 222 and 223, and updates the corresponding hot pattern recorded in the shift index table 220.

The group of optimum shift patterns from which the first hot pattern or the second hot pattern is calculated is stored in the FIFOs 222 and 223, so that the controller 200 may use the most recently obtained group of predetermined optimum shift patterns for obtaining the first hot pattern or the second hot pattern. Therefore, for example, even when the use condition of the memory system 1 by the end user changes from time to time, the optimum shift pattern obtained under the use condition close to the current use condition as much as possible can be used for acquiring the first hot pattern or the second hot pattern. Therefore, the probability of successful error correction is improved in the shift read using the first hot pattern or the second hot pattern.

In the embodiment, the controller 200 acquires an average value for each of the read voltages Vra to Vrg from the group of optimum shift patterns, and sets a set of average values as a new hot pattern. The calculation for obtaining the hot pattern is not limited to calculation of an average. For example, the controller 200 calculates an average and a standard deviation for each of the read voltages Vra to Vrg, and calculates a linear sum of the average and the standard deviation. The controller 200 may then use a set of linear sum of the average and the standard deviation as the new hot pattern.

In addition, the storage destination of the group of optimum shift patterns to be the basis for calculating the first hot pattern or the second hot pattern is not necessarily the storage area of the FIFO structure. For example, the controller 200 may generate the histogram for each of the read voltages Vra to Vrg and store a group of optimum shift patterns in the RAM 202 as the histogram for each of the read voltages Vra to Vrg. In this case, the controller 200 may perform predetermined calculation on each of the read voltages Vra to Vrg on the basis of the histogram, and set a value obtained by the calculation as a new hot pattern. The method of the predetermined calculation is not limited to a specific method. For example, the predetermined calculation is a calculation of acquiring a median value, a mode value, a maximum value, a minimum value, or a value obtained on the basis of the median value, the mode value, the maximum value, or the minimum value.

In addition, according to the embodiment, as illustrated in FIG. 15, the controller 200 selects the hot patterns recorded in the entries ID1 and ID2 in preference to the shift patterns of fixed values (that is, not updateable) recorded in other entries. In other words, when the shift read is executed, the controller 200 selects the hot pattern before the shift pattern with the fixed value.

The hot pattern is based on the optimum shift pattern obtained under the actual use condition by the end user. Therefore, the shift read using the hot pattern may have a higher possibility of successful error correction than a shift pattern having another fixed value. Since the shift pattern is preferentially used, it is possible to suppress the number of times of the shift read executed until read data not including an error bit is obtained.

In addition, according to the embodiment, the controller 200 updates the second hot pattern only when the management ID is updated for the first time after the completion of the write operation.

Therefore, even when an event of unsuccessful error correction occurs in the read operation using the shift pattern indicated by the management ID after the completion of the write operation, it is possible to perform the read operation using the second hot pattern generated on the basis of the group of the optimum shift patterns collected under similar conditions. Therefore, the possibility of successful error correction can be increased.

In addition, according to the embodiment, the memory cell array 111 is divided into the plurality of planes, and the controller 200 individually records the second hot pattern for each plane.

Therefore, it is possible to generate, as the second hot pattern, the shift pattern according to the tendency of change of the threshold voltage that may be different for each memory chip CP or for each plane in the memory chip CP.

Note that the controller 200 does not necessarily record the second hot pattern for each plane. The controller 200 may record the second hot pattern for each memory chip CP or for each optional unit area, or may record one second hot pattern in the entire system.

In addition, the controller 200 may record the first hot pattern for each plane, for each memory chip CP, or for each optional unit area.

(First Modification)

In the above description, when the error correction is successful in the patrol read (S204 in FIG. 14: Yes), the controller 200 updates the management ID using the index indicating the shift pattern, which is used when the error correction is successful and is one of the shift patterns recorded in the shift index table 220. However, the method of obtaining the new management ID is not limited thereto.

For example, the controller 200 may obtain a new management ID on the basis of the shift pattern calculation operation.

In the shift pattern calculation operation, the controller 200 compares the read data before the error correction by the ECC 206 with the read data after the error correction by the ECC 206. Then, the controller 200 acquires an evaluation index on the basis of the number of bits in which the data corresponding to the "Si" state is erroneously read as the data corresponding to the "Si+1" state adjacent to the "Si" state and the number of bits in which the data corresponding to the "Si+1" state is erroneously read as the data corresponding to the "Si" state. Then, on the basis of the evaluation index, the controller 200 calculates a shift amount that can suppress the number of occurrence of error bits with respect to the read voltage corresponding to the boundary between the "Si" state and the "Si+1" state.

Hereinafter, a bit in which data corresponding to the "Si" state is erroneously read as data corresponding to the "Si+1" state is referred to as a bit SitoSi+1. A bit in which data corresponding to the "Si+1" state is erroneously read as data corresponding to the "Si" state is referred to as a bit Si+1toSi.

Figure 17:
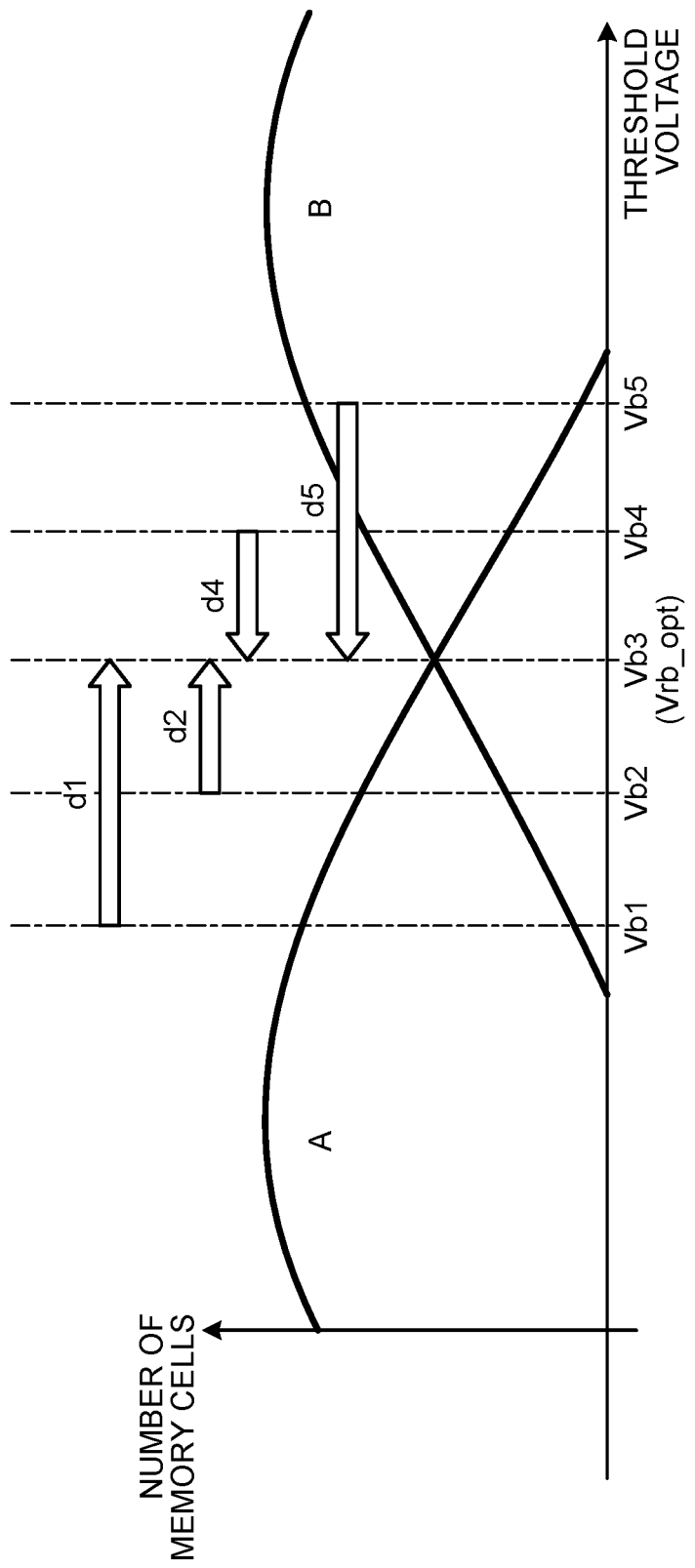
FIG. 17 is a diagram illustrating a shift pattern calculation operation according to a first modification of the embodiment.
Figure 18:
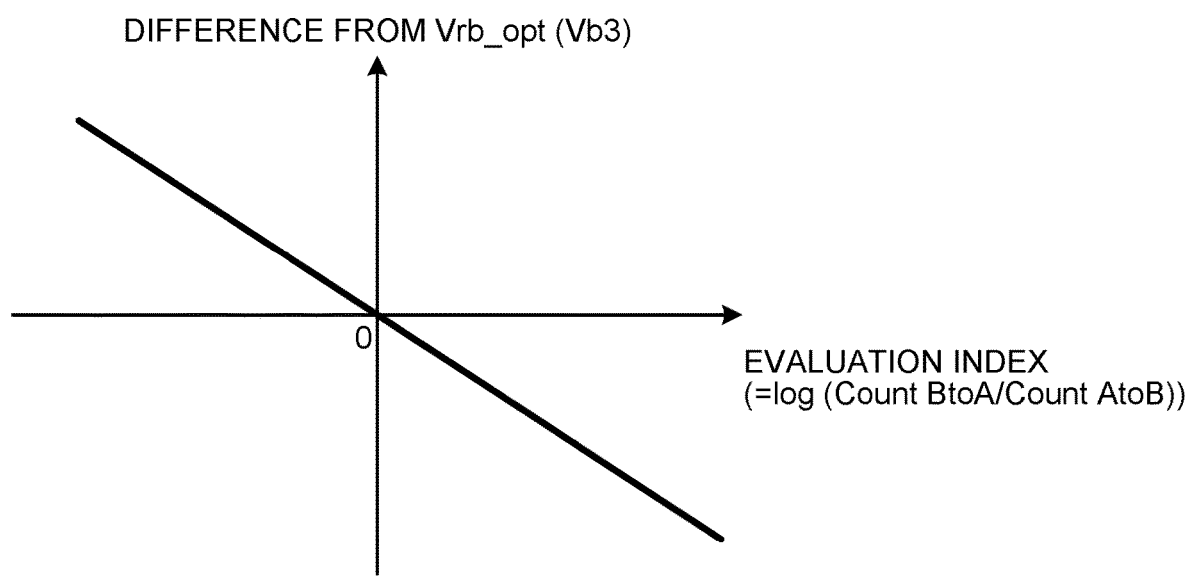
FIG. 18 is a diagram illustrating the shift pattern calculation operation according to the first modification of the embodiment.

FIGS. 17 and 18 are diagrams illustrating a shift pattern calculation operation according to a first modification of the embodiment. In FIGS. 17 and 18, examples of two adjacent states include an "A" state and a "B" state.

FIG. 17 illustrates a lobe according to the "A" state and a lobe according to the "B" state. The two lobes change due to various factors and overlap each other. When the read operation is executed using each of voltages Vb1 to Vb5 as the read voltages on these two lobes, a ratio between the number of bits AtoB (denoted as a count AtoB) and the number of bits BtoA (denoted as a count BtoA) changes depending on the read voltage.

When Vb3 is used as the read voltage, the count AtoB is equal to the count BtoA. When Vb4 or Vb5 is used as the read voltage, the count AtoB is smaller than the count BtoA. When Vb5 is used as the read voltage, a difference between the count AtoB and the count BtoA is larger than that when Vb4 is used as the read voltage. When Vb1 or Vb2 is used as the read voltage, the count AtoB is greater than the count BtoA. When Vb1 is used as the read voltage, a difference between the count AtoB and the count BtoA is larger than that when Vb2 is used as the read voltage.

When the voltage Vb3, at which the count AtoB is equal to the count BtoA, is used as the read voltage, the number of error bits can be minimized. In other words, the voltage Vb3 is considered to correspond to an optimum value Vrb_opt of the read voltage Vrb. Then, as the read voltage Vrb becomes larger than the voltage Vb3, a ratio of the count BtoA to the count AtoB becomes larger. As the read voltage Vrb becomes smaller than the voltage Vb3, the ratio of the count BtoA to the count AtoB becomes smaller.

FIG. 18 is a graph illustrating a relationship between a common logarithm of the ratio of the count BtoA to the count AtoB and differences d1 to d5 between the voltage Vrb_opt (namely, Vb3) and the voltages Vb1 to Vb5. According to this example, it can be read that the common logarithm of the ratio of the count BtoA to the count AtoB and the differences d1 to d5 have a linear relationship.

The designer causes the controller 200 to hold a relational expression illustrated in FIG. 18 as it is or in a form of a table or the like. The controller 200 acquires the count AtoB and the count BtoA on the basis of a comparison between the read data before the error correction by the ECC 206 and the read data after the error correction by the ECC 206. Then, the controller 200 calculates the common logarithm of the ratio of the count BtoA to the count AtoB as the evaluation index. Then, the controller 200 calculates a difference voltage with which the common logarithm of the ratio of the count BtoA to the count AtoB can be set to 0 as the evaluation index on the basis of the evaluation index acquired by the calculation and the relational expression. Then, the controller 200 acquires the voltage Vrb_opt by applying the acquired differential voltage to the read voltage value used for acquiring the read data.

The controller 200 acquires the optimum shift pattern by executing the above series of processing also for each of the read voltages Vra and Vrc to Vrg.

As described above, the controller 200 may acquire the optimum shift pattern by executing the shift pattern calculation operation even when the error correction is successful in the patrol read.

When the optimum shift pattern is acquired by the shift pattern calculation operation, the controller 200 sets the shift pattern most similar to the optimum shift pattern of the shift patterns recorded in the shift index table 220 as the most suitable shift pattern of the shift patterns recorded in the shift index table 220 in the processing of S207 in FIG. 14. In addition, in the processing of S211 in FIG. 14, the controller 200 inputs the optimum shift pattern acquired by the shift pattern calculation operation to the FIFO 223 corresponding to the combination of the memory chip CP and plane to which the target block belongs, of the FIFOs 223-0 to 223-7 corresponding to the eight second hot patterns indicated by ID 2. As a result, the oldest optimum shift pattern stored in the FIFO 223 is deleted from the FIFO 223. The controller 200 calculates an average value of all shift patterns in the FIFO 223 for each of the read voltages Vra to Vrg. Then, the controller 200 records the obtained set of average values as a new second hot pattern in the overwriting manner in the second hot pattern corresponding to the combination of the memory chip CP and plane to which the target block belongs, of the eight second hot patterns indicated by the ID 2.

As described above, according to the first modification, when the error correction is successful in the read operation, the controller 200 acquires the optimum shift pattern on the basis of the comparison between the read data before the error correction and the read data after the error correction. Then, the controller 200 updates the first hot pattern or the first hot pattern and the second hot pattern on the basis of the acquired optimum shift pattern.

In other words, although the error correction is successful when the read operation is performed, the controller 200 calculates the optimum shift pattern and updates the hot pattern with the optimum shift pattern obtained by the calculation. The updated hot pattern can be obtained from the shift index table 220. Therefore, the possibility of successful error correction is improved in the shift read performed after the error correction fails in the host read.

(Second Modification)

In the above description, the controller 200 is provided with a condition regarding the update of the second hot pattern. Further conditions may be provided for updating the first hot pattern or the second hot pattern.

For example, the controller 200 monitors a temperature of the memory system 1 by a sensor. The controller 200 may permit update of the first hot pattern or the second hot pattern when the temperature acquired by monitoring satisfies a predetermined condition, and prohibit update of the first hot pattern or the second hot pattern when the temperature does not satisfy the predetermined condition.

The predetermined condition regarding the temperature is, for example, an environmental temperature within a predetermined temperature range. Note that the predetermined condition regarding the environmental temperature is not limited thereto.

By providing a condition regarding the temperature for the update of the first hot pattern or the second hot pattern, it is possible to prevent the update of the first hot pattern or the second hot pattern using the optimum shift pattern obtained under an irregular use condition different from a normal use condition.

Alternatively, after acquiring the optimum shift pattern, the controller 200 updates the first hot pattern or the second hot pattern when each value configuring the acquired optimum shift pattern falls within a predetermined range provided for each read voltage. The controller 200 does not update the first hot pattern or the second hot pattern when any of the acquired values constituting the optimum shift pattern does not fall within the predetermined range provided for each read voltage.

By providing a condition on the value of the optimum shift pattern with respect to the update of the first hot pattern or the second hot pattern, it is possible to prevent the update of the first hot pattern or the second hot pattern using the optimum shift pattern including, for example, an irregular value accidentally obtained.

(Third Modification)

When the error correction is successful in the patrol read (Yes in S204 in FIG. 14), the controller 200 may end the patrol read without updating the management ID.

(Fourth Modification)

In the above description, the shift index table 220 includes, as updatable entries, the entry ID1 in which the first hot pattern is recorded and the entry ID2 in which the second hot pattern is recorded. However, the shift index table 220 may not include the entry ID 2 in which the second hot pattern is recorded. In this case, after updating the management ID (S209 in FIG. 14) in the patrol read, the controller 200 skips the processing of S210 and S211 to end the patrol read. In the host read, after updating the management ID (S407 in FIG. 16), the controller 200 skips the processing of S408 and S409 to end the host read.

In the above description of the embodiment and the first to fourth modifications thereof, the shift pattern measurement operation is activated when the error correction executed in the read operation fails. However, a trigger for activating the shift pattern measurement operation is not limited thereto. The shift pattern measurement operation can be activated in response to an optional event. The shift pattern measurement operation may be activated periodically on the basis of a timer or the like.

While some embodiments have been described, these embodiments have been presented by way of example only, and are not intended to limit the scope of the inventions. Indeed, the novel embodiments described herein may be embodied in a variety of other forms; moreover, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a non-volatile first memory including a plurality of first storage areas, each of the plurality of first storage areas including a word line and a plurality of memory cells connected to the word line;
   a second memory configured to store a plurality of first candidate values each distinguished by an index; and
   a controller configured to
   execute a first read operation and an error correction, the first read operation being an operation of executing a read operation on a second storage area of the plurality of first storage areas to acquire data from the plurality of memory cells by using read voltages corresponding to threshold voltages of the plurality of memory cells, the error correction being executed on the data acquired by the first read operation,
   execute a measurement operation on the second storage area when the error correction on the data acquired by the first read operation fails, the measurement operation being an operation of acquiring a first measured value on the basis of a group of determination results, the first measured value being a value of the read voltage for suppressing a number of occurrences of error bits, the group of determination results being obtained by determining, multiple times, on/off of the plurality of memory cells while varying the read voltage,
   update, on the basis of the first measured value, a first candidate value corresponding to a first-value index of the plurality of first candidate values,
   execute a second read operation and an error correction, the second read operation being an operation of executing the read operation on a third storage area of the plurality of first storage areas, the error correction being executed on data acquired by the second read operation, and
   execute a third read operation once or more when the error correction on the data acquired by the second read operation fails, the third read operation being an operation of executing the read operation once or more on the third storage area by using, as the read voltages, different first candidate values of the plurality of first candidate values.

2. The memory system according to claim 1, wherein the controller is configured to
   execute the first read operation and the measurement operation multiple times at different timings,
   calculate a first calculated value on the basis of a group of the first measured values obtained by the measurement operation executed multiple time, and
   update the first candidate value corresponding to the first-value index with the first calculated value.

3. The memory system according to claim 2, further comprising a third memory with a FIFO structure,
   wherein the controller is configured to
   store, in the third memory, the first measured value acquired by each time of the multiple times of the measurement operation, and
   calculate the first calculated value on the basis of the group of the first measured values stored in the third memory.

4. The memory system according to claim 1, wherein the controller is configured to receive a read request from a host device and execute the first read operation in response to the read request.

5. The memory system according to claim 1, wherein the controller is configured to receive a read request from a host device and execute the first read operation multiple times at different timings irrespective of the read request.

6. The memory system according to claim 1, wherein
   the plurality of first candidate values includes
   the first candidate value corresponding to the first-value index, and
   a first candidate value corresponding to a second-value index different from the first-value index, the first candidate value corresponding to the second-value index being not updatable, and
   the controller is configured to, in the third read operation executed once or more, preferentially select the first candidate value corresponding to the first-value index over the first candidate value corresponding to the second-value index.

7. The memory system according to claim 1, wherein the controller is configured to, when the first candidate value corresponding to the first-value index is updated for a first time after completion of a write operation for the second storage area, update, on the basis of the first measured value, a first candidate value corresponding to a third-value index different from the first value of the plurality of first candidate values.

8. The memory system according to claim 1, wherein the controller is configured to, after acquiring the first measured value,
   execute updating of the first candidate value corresponding to the first-value index when a temperature or the first measured value satisfies a first condition, and
   execute no updating of the first candidate value corresponding to the first-value index when the temperature or the first measured value does not satisfy the first condition.

9. The memory system according to claim 1, wherein
   the plurality of first storage areas is divided into a plurality of storage area groups, and
   the second memory is configured to store the plurality of first candidate values for each of the storage area groups.

10. The memory system according to claim 1, wherein the controller is configured to, in the first read operation,
  execute a fourth read operation and execute an error correction on data acquired by the fourth read operation, the fourth read operation being an operation of executing the read operation on the second storage area by using a second candidate value as the read voltage, the second candidate value being one of the plurality of first candidate values,
  when the error correction on the data acquired by the fourth read operation fails, execute a fifth read operation once or more and execute an error correction on data acquired at each time when the fifth read operation is executed, the fifth read operation being an operation of executing the read operation once or more on the second storage area by using, as the read voltages, different first candidate values of the plurality of first candidate values, and
  update the first candidate value corresponding to the first-value index when the error correction is successful on the data acquired by any one of the fifth read operation executed once or more, the first candidate being updated on the basis of a third candidate value used when the error correction is successful, the third candidate value being a first candidate value of the plurality of first candidate values.

11. The memory system according to claim 1, wherein the controller is configured to, when the error correction on the data acquired by the first read operation is successful,
  calculate a second calculated value being a value of the read voltage for suppressing the number of occurrences of error bits, the second calculated value being calculated on the basis of a comparison between data before the error correction and data after the error correction, and
  update, on the basis of the second calculated value, the first candidate value corresponding to the first-value index of the plurality of first candidate values.

12. The memory system according to claim 3, wherein the controller is configured to calculate, in the calculation of the first calculated value, an average value of the group of the first measured values stored in the third memory.

13. The memory system according to claim 1, wherein the controller is configured to
  execute the first read operation and the measurement operation multiple times at different timings,
  calculate a first calculated value on the basis of a histogram of the first measured value acquired by the measurement operation executed multiple time, and
  update the first candidate value corresponding to the first-value index with the first calculated value.

14. A memory system comprising:
  a non-volatile first memory including a plurality of first storage areas, each of the plurality of first storage areas including a word line and a plurality of memory cells connected to the word line;
  a second memory configured to store a plurality of first candidate values each distinguished by an index; and
  a controller configured to
    execute a measurement operation on a second storage area of the plurality of first storage areas, the measurement operation being an operation of acquiring a first measured value on the basis of a group of determination results, the first measured value being a value of the read voltage for suppressing a number of occurrences of error bits, the group of determination results being obtained by determining, multiple times, on/off of the plurality of memory cells while varying the read voltage,
    update, on the basis of the first measured value, a first candidate value corresponding to a first-value index of the plurality of first candidate values,
    execute a first read operation and an error correction, the first read operation being an operation of executing a read operation on a third storage area of the plurality of first storage areas to acquire data from the plurality of memory cells by using read voltages corresponding to threshold voltages of the plurality of memory cells, the error correction being executed on the data acquired by the first read operation, and
    execute a second read operation once or more when the error correction on the data acquired by the first read operation fails, the second read operation being an operation of executing the read operation once or more on the third storage area by using, as the read voltages, different first candidate values of the plurality of first candidate values.

15. A method of controlling a non-volatile memory including a plurality of first storage areas, each of the plurality of first storage areas including a word line and a plurality of memory cells connected to the word line, the method comprising:
  storing a plurality of first candidate values in a first memory, each of the plurality of first candidate values being distinguished by an index;
  executing a first read operation and an error correction, the first read operation being an operation of executing a read operation on a second storage area of the plurality of first storage areas to acquire data from the plurality of memory cells by using read voltages corresponding to threshold voltages of the plurality of memory cells, the error correction being executed on the data acquired by the first read operation;
  executing a measurement operation on the second storage area when the error correction on the data acquired by the first read operation fails, the measurement operation being an operation of acquiring a first measured value on the basis of a group of determination results, the first measured value being a value of the read voltage for suppressing a number of occurrences of error bits, the group of determination results being obtained by determining, multiple times, on/off of the plurality of memory cells while varying the read voltage;
  updating, on the basis of the first measured value, a first candidate value corresponding to a first-value index of the plurality of first candidate values;
  executing a second read operation and an error correction, the second read operation being an operation of executing the read operation on a third storage area of the plurality of first storage areas, the error correction being executed on data acquired by the second read operation; and
  executing a third read operation once or more when the error correction on the data acquired by the second read operation fails, the third read operation being an operation of executing the read operation once or more on the third storage area by using, as the read voltages, different first candidate values of the plurality of first candidate values.

16. The method according to claim 15, further comprising:
  executing the first read operation and the measurement operation multiple times at different timings;

calculating a first calculated value on the basis of a group of the first measured values obtained by the measurement operation executed multiple time; and updating the first candidate value corresponding to the first-value index with the first calculated value.

17. The method according to claim 16, further comprising:

storing, in a second memory with a FIFO structure, the first measured value acquired by each time of the multiple times of the measurement operation; and calculating the first calculated value on the basis of the group of the first measured values stored in the second memory.

18. The method according to claim 15, wherein the plurality of first candidate values includes the first candidate value corresponding to the first-value index, and a first candidate value corresponding to a second-value index different from the first-value index, the first candidate value corresponding to the second-value index being not updatable, and the method further comprises, in the third read operation executed once or more, preferentially selecting the first candidate value corresponding to the first-value index over the first candidate value corresponding to the second-value index.

19. The method according to claim 15, further comprising, when the first candidate value corresponding to the first-value index is updated for a first time after completion of a write operation for the second storage area, updating, on the basis of the first measured value, a first candidate value corresponding to a third-value index different from the first value of the plurality of first candidate values.

20. The method according to claim 15, further comprising, after acquiring the first measured value, executing updating of the first candidate value corresponding to the first-value index when a temperature or the first measured value satisfies a first condition; and executing no updating of the first candidate value corresponding to the first-value index when the temperature or the first measured value does not satisfy the first condition.

* * * * *